(12) United States Patent
Takahashi

(10) Patent No.: US 10,249,619 B2
(45) Date of Patent: Apr. 2, 2019

(54) POWER SEMICONDUCTOR DEVICE HAVING TRENCH GATE TYPE IGBT AND DIODE REGIONS

(71) Applicant: Mitsubishi Electric Corporation, Tokyo (JP)

(72) Inventor: Tetsuo Takahashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/914,256

(22) Filed: Mar. 7, 2018

(65) Prior Publication Data

US 2018/0197854 A1 Jul. 12, 2018

Related U.S. Application Data

(62) Division of application No. 15/356,035, filed on Nov. 18, 2016, now Pat. No. 9,972,617, which is a division
(Continued)

(30) Foreign Application Priority Data

Dec. 3, 2014 (JP) .................................. 2014-244756

(51) Int. Cl.
*H01L 29/66* (2006.01)
*H01L 29/73* (2006.01)
(Continued)

(52) U.S. Cl.
CPC ...... *H01L 27/0664* (2013.01); *H01L 27/0207* (2013.01); *H01L 27/0635* (2013.01);
(Continued)

(58) Field of Classification Search
CPC ......... H01L 29/66348; H01L 29/66333; H01L 29/7393; H01L 29/7395; H01L 29/7396;
(Continued)

(56) References Cited

U.S. PATENT DOCUMENTS 5,838,026 A 11/1998 Kitagawa et al.
6,323,518 B1 * 11/2001 Sakamoto ............... H01L 23/62
257/330
(Continued)

FOREIGN PATENT DOCUMENTS

CN 102376709 A 3/2012
JP 2007-227806 A 9/2007
(Continued)

OTHER PUBLICATIONS

An Office Action; "Notification of Reason for Refusal" issued by the Japanese Patent Office dated Aug. 29, 2017, which corresponds to Japanese Patent Application No. 2014-244756 and is related to U.S. Appl. No. 15/356,035.
(Continued)

*Primary Examiner* — Ida M Soward
(74) *Attorney, Agent, or Firm* — Studebaker & Brackett PC

(57) ABSTRACT

Switching loss is reduced. A first surface of a semiconductor substrate has a portion included in an IGBT region and a portion included in a diode region. Trenches formed in the first surface include a gate trench and a boundary trench disposed between the gate trench and the diode region. A fourth layer of the semiconductor substrate is provided on the first surface and has a portion included in the diode region. The fourth layer includes a trench-covering well region that covers the deepest part of the boundary trench, a plurality of isolated well regions, and a diffusion region that connects the trench-covering well region and the isolated well regions. The diffusion region has a lower impurity concentration than that of the isolated well regions. A first electrode is in contact with the isolated well regions and away from the diffusion region.

1 Claim, 20 Drawing Sheets

Related U.S. Application Data of application No. 14/869,200, filed on Sep. 29, 2015, now Pat. No. 9,543,293.

(51) Int. Cl.

| | | |
|---|---|---|
| *H01L 29/06* | (2006.01) | |
| *H01L 29/10* | (2006.01) | |
| *H01L 29/86* | (2006.01) | |
| *H01L 27/06* | (2006.01) | |
| *H01L 27/02* | (2006.01) | |
| *H01L 27/07* | (2006.01) | |
| *H01L 29/739* | (2006.01) | |
| *H01L 29/861* | (2006.01) | |
| *H01L 29/08* | (2006.01) | |

(52) U.S. Cl.
CPC ...... *H01L 27/0727* (2013.01); *H01L 29/0688* (2013.01); *H01L 29/0696* (2013.01); *H01L 29/0834* (2013.01); *H01L 29/1083* (2013.01); *H01L 29/1095* (2013.01); *H01L 29/66136* (2013.01); *H01L 29/7397* (2013.01); *H01L 29/861* (2013.01); *H01L 29/66333* (2013.01); *H01L 29/66348* (2013.01); *H01L 29/7393* (2013.01); *H01L 29/7395* (2013.01); *H01L 29/7396* (2013.01); *H01L 2924/13055* (2013.01)

(58) Field of Classification Search
CPC ............. H01L 29/7397; H01L 29/0688; H01L 29/0696; H01L 29/1083; H01L 29/1095; H01L 29/66136; H01L 29/861; H01L 27/0664; H01L 27/0207; H01L 27/0635; H01L 27/0727; H01L 2924/13055
See application file for complete search history.

(56) References Cited

U.S. PATENT DOCUMENTS

| | | | |
|---|---|---|---|
| 6,768,168 B1 | 7/2004 | Takahashi | |
| 6,781,200 B2 | 8/2004 | Ishimura et al. | |
| 7,400,017 B2 | 7/2008 | Aono et al. | |
| 7,616,859 B2 | 11/2009 | Tokura et al. | |
| 7,897,997 B2 * | 3/2011 | Hsieh | H01L 27/0255 257/139 |
| 8,362,519 B2 * | 1/2013 | Soeno | H01L 27/0664 257/133 |
| 8,421,184 B2 | 4/2013 | Koyama et al. | |
| 8,564,047 B2 * | 10/2013 | Hsieh | H01L 29/66348 257/328 |
| 8,569,780 B2 * | 10/2013 | Hsieh | H01L 29/66106 257/98 |
| 8,609,502 B1 * | 12/2013 | Koyama | H01L 27/0664 257/370 |
| 8,716,746 B2 * | 5/2014 | Koyama | H01L 29/0696 257/140 |
| 8,729,600 B2 | 5/2014 | Tsuzuki et al. | |
| 8,742,454 B2 * | 6/2014 | Iwasaki | H01L 29/7393 257/140 |
| 8,841,699 B2 * | 9/2014 | Tsuzuki | H01L 21/263 257/138 |
| 9,041,050 B2 | 5/2015 | Matsuura | |
| 9,064,711 B2 * | 6/2015 | Senoo | H01L 29/0834 |
| 9,159,722 B2 * | 10/2015 | Ogura | H01L 27/0761 |
| 9,219,060 B2 * | 12/2015 | Ogura | H01L 29/7397 |
| 9,224,730 B2 * | 12/2015 | Tanabe | H01L 29/66348 |
| 9,287,391 B2 | 3/2016 | Chen et al. | |
| 9,318,587 B2 | 4/2016 | Bobde et al. | |
| 9,356,141 B2 | 5/2016 | Wood et al. | |
| 9,379,224 B2 * | 6/2016 | Soeno | H01L 29/407 |
| 9,397,206 B2 * | 7/2016 | Kameyama | H01L 29/861 |
| 9,843,181 B2 * | 12/2017 | Mauder | H01L 29/7397 |
| 2004/0191994 A1 * | 9/2004 | Williams | H01L 27/0255 438/270 |
| 2005/0045945 A1 | 3/2005 | Yoshikawa et al. | |
| 2007/0200138 A1 | 8/2007 | Ozeki et al. | |
| 2008/0048295 A1 | 2/2008 | Takahashi | |
| 2009/0001411 A1 * | 1/2009 | Tokura | H01L 27/0664 257/140 |
| 2010/0078775 A1 | 4/2010 | Mauder et al. | |
| 2010/0090248 A1 | 4/2010 | Kouno | |
| 2010/0219785 A1 * | 9/2010 | Hirose | H01L 27/0658 318/519 |
| 2010/0291767 A1 | 11/2010 | Miura | |
| 2011/0012171 A1 | 1/2011 | Kobayashi | |
| 2012/0043581 A1 | 2/2012 | Koyama et al. | |
| 2012/0193641 A1 | 8/2012 | Arai et al. | |
| 2012/0256250 A1 | 10/2012 | Schulze et al. | |
| 2013/0115739 A1 | 5/2013 | Akiyama et al. | |
| 2014/0042530 A1 | 2/2014 | Cho et al. | |
| 2014/0084337 A1 | 3/2014 | Matsudai et al. | |
| 2014/0357048 A1 | 12/2014 | Meiser et al. | |
| 2015/0035006 A1 * | 2/2015 | Yoshimochi | H01L 29/866 257/140 |
| 2015/0144995 A1 * | 5/2015 | Takahashi | H01L 29/7397 257/139 |
| 2015/0162423 A1 * | 6/2015 | Lee | H01L 21/265 257/139 |
| 2015/0228723 A1 * | 8/2015 | Werber | H01L 29/0619 257/140 |
| 2015/0263144 A1 | 9/2015 | Misu et al. | |
| 2015/0279931 A1 | 10/2015 | Chen et al. | |
| 2015/0380484 A1 | 12/2015 | Yoshimochi | |
| 2016/0079442 A1 | 3/2016 | Fujii | |
| 2016/0284588 A1 | 9/2016 | Yoshimochi | |
| 2016/0329323 A1 * | 11/2016 | Iwasaki | H01L 29/32 |

FOREIGN PATENT DOCUMENTS

| | | |
|---|---|---|
| JP | 2007-258363 A | 10/2007 |
| JP | 2008-053648 A | 3/2008 |
| JP | 2008-300529 A | 12/2008 |
| JP | 2009-021557 A | 1/2009 |
| JP | 2009-170670 A | 7/2009 |
| JP | 2012-054403 A | 3/2012 |

OTHER PUBLICATIONS

An Office Action issued by the Chinese Patent Office dated Mar. 26, 2018, which corresponds to Chinese Patent Application No. 201510882702.1 and is related to U.S. Appl. No. 15/914,256; with English Translation.

An Office Action issued by the German Patent and Trademark Office dated Nov. 13, 2018, which corresponds to German Patent Application No. 10 2015 221 466.4 and is related to U.S. Appl. No. 15/914,256; with English Translation.

\* cited by examiner

F I G . 1
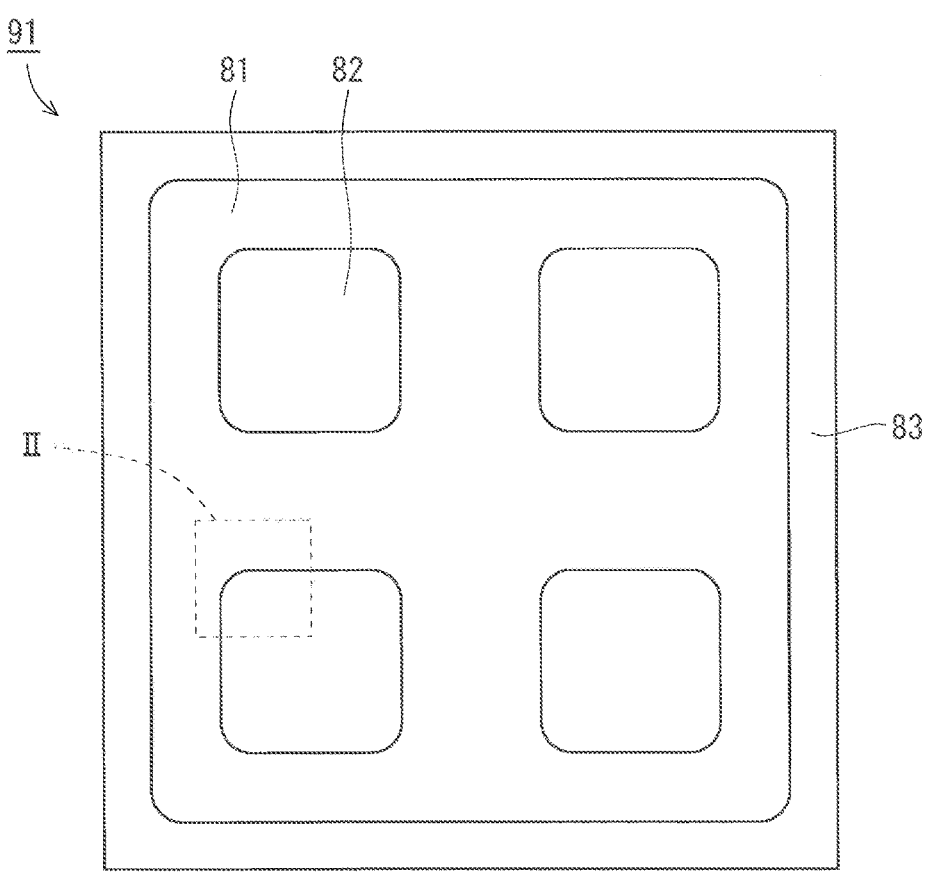

F I G . 5
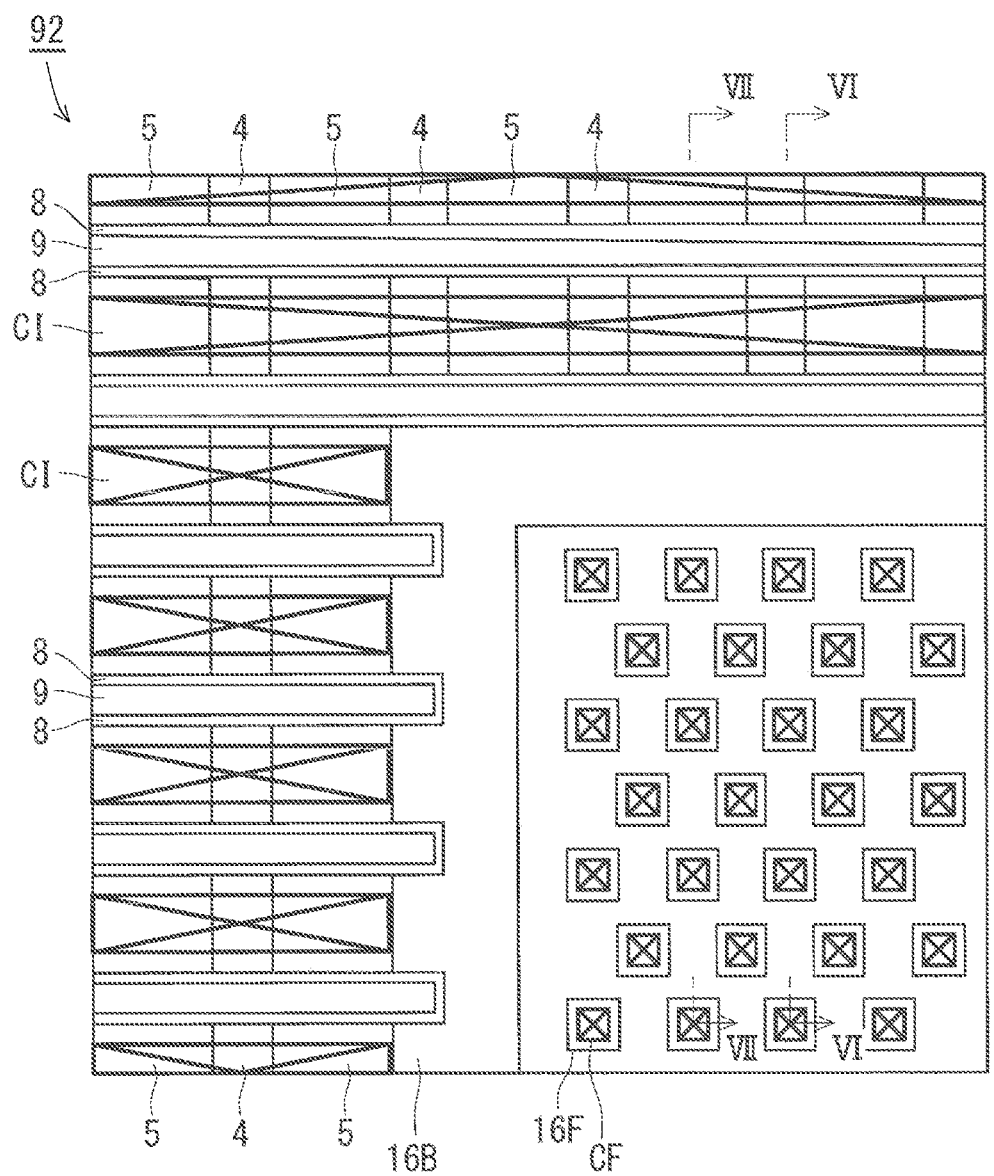

F I G . 1 2
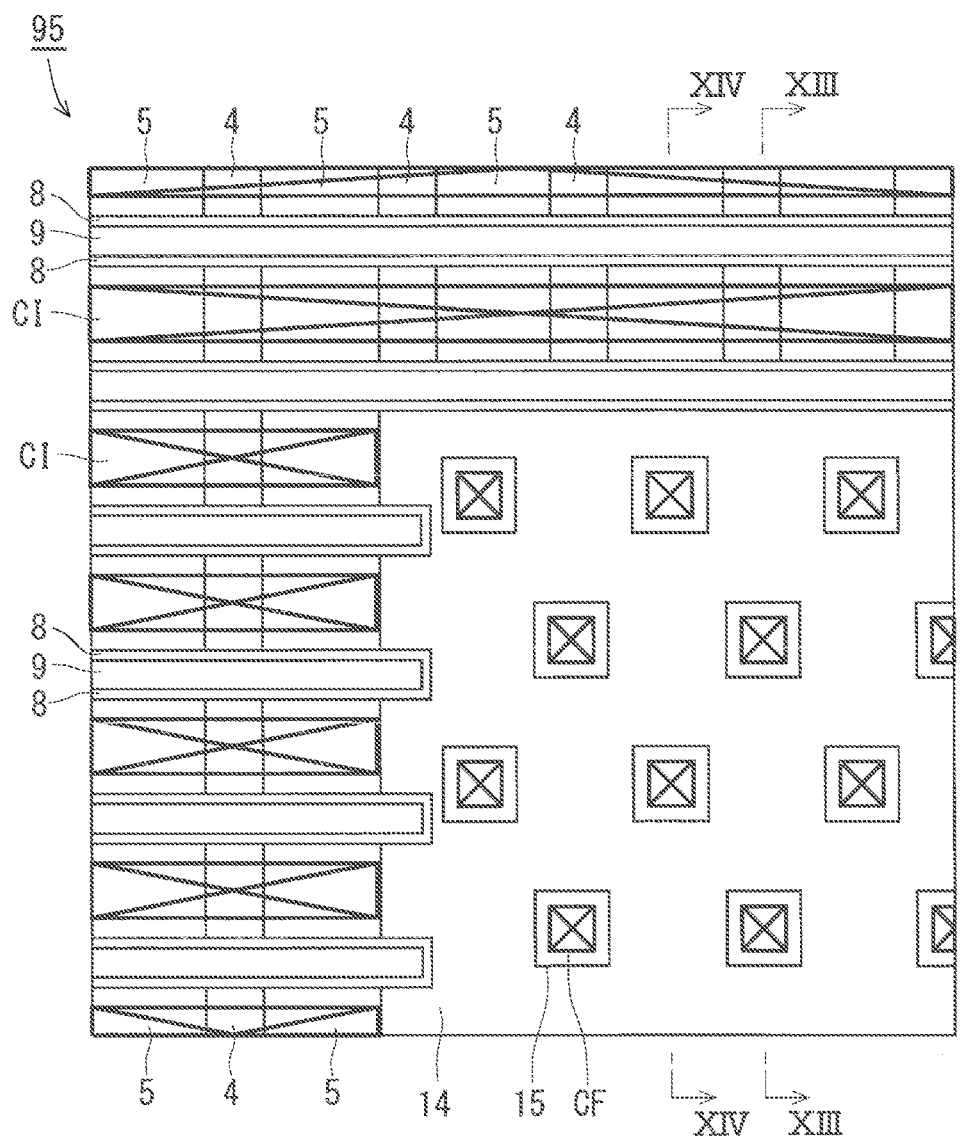

POWER SEMICONDUCTOR DEVICE HAVING TRENCH GATE TYPE IGBT AND DIODE REGIONS

CROSS-REFERENCE TO RELATED APPLICATIONS

The present application is a Divisional Application of U.S. patent application Ser. No. 15/356,035 filed Nov. 18, 2016, which is a Divisional Application of U.S. patent application Ser. No. 14/869,200 filed Sep. 29, 2015, which claims priority from Japanese Patent Application No. 2014-244756 filed Dec. 3, 2014, the contents of which are all herein incorporated by reference in their entirety.

BACKGROUND OF THE INVENTION

Field of the Invention

The present invention relates to a power semiconductor device and in particular to a power semiconductor device having an IGBT region and a diode region for reverse conduction of the IGBT region.

Description of the Background Art

There are generally various demands on power semiconductor devices, such as loss reduction, the capacity to withstand a high voltage, and the guarantee of the safety operating area in order to prevent breakdown of elements during operation. While satisfying these demands, the decrease in size and weight of devices has also been progressing. There is also demand for the ability to fulfill the above demands at a cost as low as possible. The progress of this power semiconductor device technology leads to consideration to global environment in terms of a reduction in energy consumption.

In particular, with power semiconductor devices having functions of an insulated gate bipolar transistor (IGBT) and a free-wheeling diode (FWD), a reverse-conducting IGBT (RC-IGBT) having a structure in which both the IGBT and the FWD are formed on a single semiconductor substrate has been proposed as a method for reducing size and weight. An ordinary IGBT has only a $p^+$ collector layer on the back surface of the semiconductor substrate, but a feature of the RC-IGBT is that both a $p^+$ collector layer and an $n^+$ cathode layer are formed on the semiconductor substrate. The current path of the RC-IGBT passes through the $p^+$ collector layer when the RC-IGBT operates as an IGBT, whereas it passes through the $n^+$ cathode layer when the RC-IGBT operates as an FWD. To suppress the switching loss of the RC-IGBT, the FWD is required to combine a low recovery current and a small forward voltage drop.

Lifetime control technology is known as a method for reducing the recovery current of the FWD, but this method has a tradeoff relationship with a forward voltage drop. In particular, in the case of the RC-IGBT, which has a FWD and an IGBT on the same substrate, lifetime control can result in an increase in ON-state voltage when the RC-IGBT operates as an IGBT.

Another problem specific to the RC-IGBT is an increase in steady-state loss caused by an increase in forward voltage due to snapback when the RC-IGBT operates as an IGBT or as a FWD, the details of which will be described below.

To maintain a low forward voltage when the RC-IGBT operates as an IGBT, it is necessary to cause conductivity modulation by forward biasing the pn junction between the $p^+$ collector layer and an n layer including an $n^-$ drift layer so that holes are injected from the $p^+$ collector layer into the $n^-$ drift layer. The RC-IGBT, however, has not only the $p^+$ collector layer but also the $n^+$ cathode layer on the back surface of the semiconductor substrate, so that there is a path through which electron current from the emitter electrode flows into the $n^+$ cathode layer. Thus, snapback occurs until the above pn junction is turned on, and this keeps conductivity modulation from occurring. This increases the ON-state voltage of the IGBT in a low current region and accordingly increases the steady-state loss.

The same kind of problem also arises when the RC-IGBT operates as an FWD in which the reverse current flows. When a channel of an n-channel MOSFET structure that is included in the IGBT is set in an accumulation state by taking the gate voltage as positive, there is a path through which electron current from the $n^+$ cathode layer flows toward the channel. Thus, similar snapback occurs as described above. This increases the forward voltage drop (Vf) of the diode and accordingly increases the steady-state loss.

To suppress the steady-state loss, it is necessary to suppress the aforementioned snapback. For example, Japanese Patent Application Laid-Open No. 2008-53648 discloses an RC-IGBT having a first region where an IGBT is formed, and a second region where a diode is formed. The IGBT region includes a plurality of cells. This RC-IGBT has a smaller number of current paths that can cause snapback than in the case where each cell includes both an IGBT and a diode, thus reducing the influence of snapback.

The above-described technique of Japanese Patent Application Laid-Open No. 2008-53648 can suppress snapback, but the switching loss cannot be reduced sufficiently because of a large recovery current flowing when the RC-IGBT operates as an FWD.

SUMMARY OF THE INVENTION

The present invention has been achieved in order to solve the above-described problems, and it is an object of the present invention to provide a power semiconductor device that has an IGBT region and a diode region for reverse conduction of the IGBT region and that is capable of reducing the switching loss.

A power semiconductor device according to one aspect of the present invention has a trench gate type IGBT region and a diode region for reverse conduction of the IGBT region. The power semiconductor device includes a semiconductor substrate, a gate insulating film, a trench electrode, an interlayer insulating film, a first electrode, and a second electrode.

The semiconductor substrate has a first surface and a second surface opposite the first surface, the first surface having a portion included in the IGBT region and a portion included in the diode region. The semiconductor substrate includes a first layer of a first conductivity type, a second layer of a second conductivity type different from the first conductivity type, a third layer of the second conductivity type, a fourth layer of the second conductivity type, a fifth layer of the first conductivity type, a sixth layer of the second conductivity type, and a seventh layer of the first conductivity type. The first layer is provided on the first surface and away from the second surface in the IGBT region. The second layer is provided on the first surface and away from the second surface in the IGBT region. The third layer is provided away from the first surface and the second surface in the IGBT region and is in contact with the first layer and the second layer. The fourth layer has a portion included in the diode region and is provided on the first surface and away from the second surface. The fifth layer is in contact with the third layer in the IGBT region and is in contact with the fourth layer in the diode region. The sixth layer is provided on the second surface, is at least partially included in the IGBT region, and is in contact with the fifth layer. The seventh layer is provided on the second surface, is at least partially included in the diode region, and is in contact with the fifth layer. The first surface of the semiconductor substrate is provided with a plurality of trenches each having a side wall. The plurality of trenches includes a gate trench and a boundary trench, the gate trench having a gate side wall that has a surface formed of the first layer, the third layer, and the fifth layer as the side wall, and the boundary trench being disposed between the gate trench and the diode region and having a boundary side wall that faces the diode region The gate insulating film covers the side walls of the trenches. The trench electrode is provided in the trenches via the gate insulating film. The interlayer insulating film is provided on the first surface of the semiconductor substrate and has an IGBT opening and a diode opening, the IGBT opening exposing the first layer and the second layer, and the diode opening exposing part of the fourth layer. The first electrode is provided on the interlayer insulating film, is in contact with the first layer and the second layer through the IGBT opening, and is in contact with the fourth layer through the diode opening. The second electrode is provided on the second surface of the semiconductor substrate and is in contact with the sixth layer and the seventh layer, The fourth layer includes a trench-covering well region that covers a deepest part of the boundary side wall, a plurality of isolated well regions that are disposed separately from the trench-covering well region, and a diffusion region that connects the trench-covering well region and the plurality of isolated well regions. The diffusion region has a lower impurity concentration than impurity concentrations of the trench-covering well region and the isolated well regions when impurity concentrations in a direction parallel to the first surface of the semiconductor substrate are compared. The first electrode is in contact with the isolated well regions and away from the diffusion region.

A power semiconductor device according to another aspect of the present invention has a trench gate type IGBT region and a diode region for reverse conduction of the IGBT region. The power semiconductor device includes a semiconductor substrate, a gate insulating film, a trench electrode, an interlayer insulating film, a first electrode, and a second electrode.

The semiconductor substrate has a first surface and a second surface opposite the first surface, the first surface having a portion included in the IGBT region and a portion included in the diode region. The semiconductor substrate includes a first layer of a first conductivity type, a second layer of a second conductivity type different from the first conductivity type, a third layer of the second conductivity type, a fourth layer of the second conductivity type, a fifth layer of the first conductivity type, a sixth layer of the second conductivity type, and a seventh layer of the first conductivity type. The first layer is provided on the first surface and away from the second surface in the IGBT region. The second layer is provided on the first surface and away from the second surface in the IGBT region. The third layer is provided away from the first surface and the second surface in the IGBT region and is in contact with the first layer and the second layer. The fourth layer has a portion included in the diode region and is provided on the first surface and away from the second surface. The fifth layer is in contact with the third layer in the IGBT region and is in contact with the fourth layer in the diode region. The sixth layer is provided on the second surface, is at least partially included in the IGBT region, and is in contact with the fifth layer. The seventh layer is provided on the second surface, is at least partially included in the diode region, and is in contact with the fifth layer. The first surface of the semiconductor substrate is provided with a plurality of trenches each having a side wall. The plurality of trenches includes a gate trench and a boundary trench, the gate trench having a gate side wall that has a surface formed of the first layer, the third layer, and the fifth layer as the side wall, and the boundary trench being disposed between the gate trench and the diode region and having a boundary side wall that faces the diode region.

The gate insulating film covers the side walls of the trenches. The trench electrode is provided in the trenches via the gate insulating film. The interlayer insulating film is provided on the first surface of the semiconductor substrate and has an IGBT opening and a diode opening, the IGBT opening exposing the first layer and the second layer, and the diode opening exposing part of the fourth layer. The first electrode is provided on the interlayer insulating film, is in contact with the first layer and the second layer through the IGBT opening, and is in contact with the fourth layer through the diode opening. The second electrode is provided on the second surface of the semiconductor substrate and is in contact with the sixth layer and the seventh layer.

The fourth layer includes a trench-covering well region that covers a deepest part of the boundary side wall, a plurality of isolated well regions that are disposed separately from the trench-covering well region, a diffusion region that connects the trench-covering well region and the plurality of isolated well regions, and a high-concentration region. When impurity concentrations in a direction parallel to the first surface of the semiconductor substrate are compared, the diffusion region has a lower impurity concentration than impurity concentrations of the trench-covering well region and the isolated well regions, and the high-concentration region has a higher impurity concentration than impurity concentrations of the trench-covering well region and the isolated well regions. The first electrode is in contact with only the high-concentration region of the fourth layer.

A power semiconductor device according to yet another aspect of the present invention has an IGBT region that includes a plurality of cells, and a diode region for reverse conduction of the IGBT region. The power semiconductor device includes a semiconductor substrate, an interlayer insulating film, a first electrode, and a second electrode.

The semiconductor substrate has a first surface and a second surface opposite the first surface, the first surface having a portion included in the IGBT region and a portion included in the diode region. The semiconductor substrate includes a first layer of a first conductivity type, a second layer of the first conductivity type, and a third layer of a second conductivity type different from the first conductivity type. The first layer is provided on the second surface and is at least partially included in the diode region. The second layer is in contact with the first layer in the diode region. The third layer is provided on the first surface and away from the second surface, is at least partially included in the diode region, and is in contact with the second layer.

The interlayer insulating film is provided on the first surface of the semiconductor substrate and has a diode opening that exposes part of the third layer. The first electrode is provided on the interlayer insulating film and is in contact with the third layer through the diode opening.

The second electrode is provided on the second surface of the semiconductor substrate and is in contact with the first layer.

The third layer includes a first region and a plurality of second regions, the first region being provided on the whole of the first surface in the diode region, the plurality of second regions being spaced from each other on the first region. When impurity concentrations in a direction parallel to the first surface of the semiconductor substrate are compared, the second region has a higher impurity concentration than an impurity concentration of the first region. The first electrode is in contact with only the second region of the third layer.

A power semiconductor device according to further another aspect of the present invention has an IGBT region and a diode region for reverse conduction of the IGBT region. The power semiconductor device includes a semiconductor substrate, an interlayer insulating film, a first electrode, and a second electrode.

The semiconductor substrate has a first surface and a second surface opposite the first surface, the first surface having a portion included in the IGBT region and a portion included in the diode region. The semiconductor substrate includes a first layer of a first conductivity type, a second layer of the first conductivity type, and a third layer of a second conductivity type different from the first conductivity type. The first layer is provided on the second surface and is at least partially included in the diode region. The second layer is in contact with the first layer in the diode region. The third layer is provided on the first surface and away from the second surface, is at least partially included in the diode region, and is in contact with the second layer.

The interlayer insulating film is provided on the first surface of the semiconductor substrate and has a diode opening that exposes part of the third layer. The first electrode is provided on the interlayer insulating film and is in contact with the third layer through the diode opening. The second electrode is provided on the second surface of the semiconductor substrate and is in contact with the first layer.

The third layer includes a first region, a second region that is disposed away from the first region, and a diffusion region that connects the first region and the second region. When impurities in a direction parallel to the first surface of the semiconductor substrate are compared, the second region has a higher impurity concentration than an impurity concentration of the first region, and the diffusion region has a lower impurity concentration than impurity concentrations of the first region and the second region. The first electrode is in contact with only the second region of the third layer.

In the above-described power semiconductor device according to one aspect of the present invention, the diffusion region having a lower impurity concentration than those of the trench-covering well region and the isolated well regions is formed in the fourth layer. Consequently, the average impurity concentration of the fourth layer is reduced as compared to the case where the fourth layer as a whole is formed with only the impurity concentrations of the trench-covering well region or the isolated well region. This suppresses the recovery current in the diode region. The first electrode is disposed away from the diffusion region having a low impurity concentration. This prevents the forward voltage in the diode region from increasing due to a voltage drop at a contact between the first electrode and a portion of the fourth layer that has a low impurity concentration. From the above, the diode region can combine both a low forward voltage and a low recovery current. Using this diode region as a free-wheeling diode of the IGBT region can reduce the switching loss of the power semiconductor device.

In the above-described power semiconductor device according to another aspect of the present invention, the diffusion region having a lower impurity concentration than those of the trench-covering well region and the isolated well regions is formed in the fourth layer. Consequently, the average impurity concentration of the fourth layer is reduced as compared to the case where the fourth layer as a whole is formed with the impurity concentration of the trench-covering well region or the isolated well regions. This suppresses the recovery current in the diode region. The first electrode is in contact with only the high-concentration region of the fourth layer. This prevents the forward voltage in the diode region from increasing due to a voltage drop at a contact between the first electrode and a portion of the fourth layer that has a low impurity concentration. From the above, the diode region can combine both a low forward voltage and a low recovery current. Using this diode region as a free-wheeling diode of the IGBT region can reduce the switching loss of the power semiconductor device.

In the above-described power semiconductor device according to yet another aspect of the present invention, the first region having a lower impurity concentration than that of the second region is formed on the entire first surface in the diode region of the third layer. Consequently, the third layer is formed with a low impurity concentration and high uniformity in the diode region. This suppresses the recovery current in the diode region. The first electrode is in contact with only the second impurity region of the third layer. This prevents the forward voltage in the diode region from increasing due to a voltage drop at a contact between the first electrode and a portion of the third layer that has a low impurity concentration. From the above, the diode region can combine both a low forward voltage and a low recovery current. The above-described effect can be further increased because the IGBT region includes a plurality of cells. Using this diode region as a free-wheeling diode of the IGBT region can reduce the switching loss of the power semiconductor device.

In the above-described power semiconductor device according to further another aspect of the present invention, the diffusion region having a lower impurity concentration than those of the first region and the second region is formed in the third layer. Consequently, the average impurity concentration of the fourth layer is reduced as compared to the case where the fourth layer as a whole is formed with the impurity concentration of the first region or the second region. This suppresses the recovery current in the diode region. The first electrode is in contact with only the second impurity region of the third layer. This prevents the forward voltage in the diode region from increasing due to a voltage drop at a contact between the first electrode and a portion of the third layer that has a low impurity concentration. From the above, the diode region can combine both a low forward voltage and a low recovery current. Moreover, the first region and the second region do not overlap each other. This prevents the formation of a portion where the impurity concentration locally exceeds that of the second region. It is thus possible to further improve recovery characteristics. Using this diode region as a free-wheeling diode of the IGBT region can reduce the switching loss of the power semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view schematically illustrating a configuration of a power semiconductor device according to a first preferred embodiment of the present invention;

FIG. 5 is a partial plan view schematically illustrating a configuration of a power semiconductor device according to a second preferred embodiment of the present invention;

FIG. 12 is a partial plan view schematically illustrating a configuration of a power semiconductor device according to a fifth preferred embodiment of the present invention;

DESCRIPTION OF THE PREFERRED EMBODIMENTS

Figure 2:
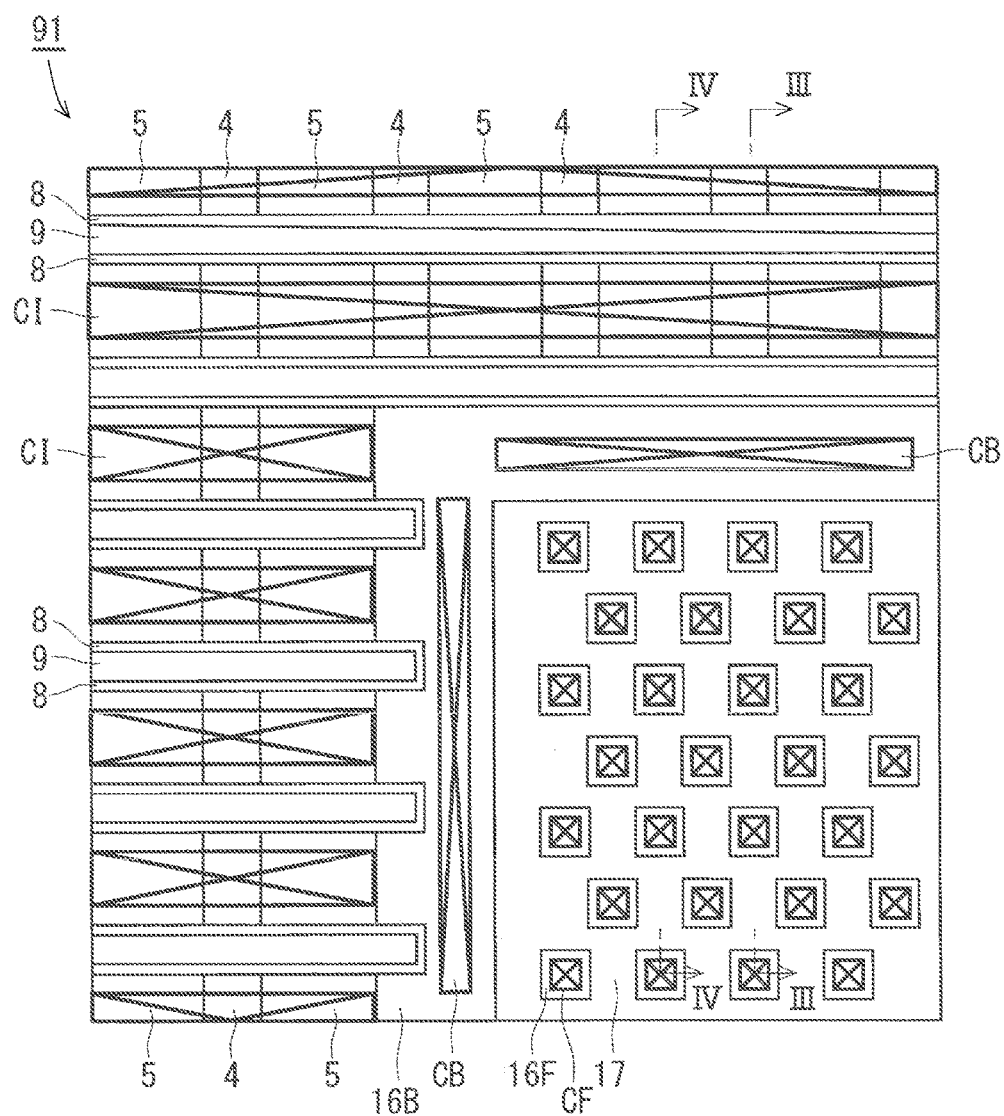
FIG. 2 is a partial plan view schematically illustrating a broken-line portion II in FIG. 1.

Preferred embodiments of the present invention will be described hereinafter with reference to the drawings. Note that constituent elements that are identical to or correspond to one another are denoted by the same reference numerals, and redundant descriptions thereof will be omitted.

First Preferred Embodiment

Referring to FIG. 1, an RC-IGBT (power semiconductor device) 91 according to the present preferred embodiment includes an IGBT region 81, an FWD region 82 (diode region), and an outer peripheral region 83 in a plan layout. The IGBT region 81 is of a trench gate type. The FWD region 82 is a region for reverse conduction of the IGBT region 81. Note that an interconnection structure including, for example, a metal gate interconnection region or a gate pad is not illustrated in FIG. 1.

Figure 3:
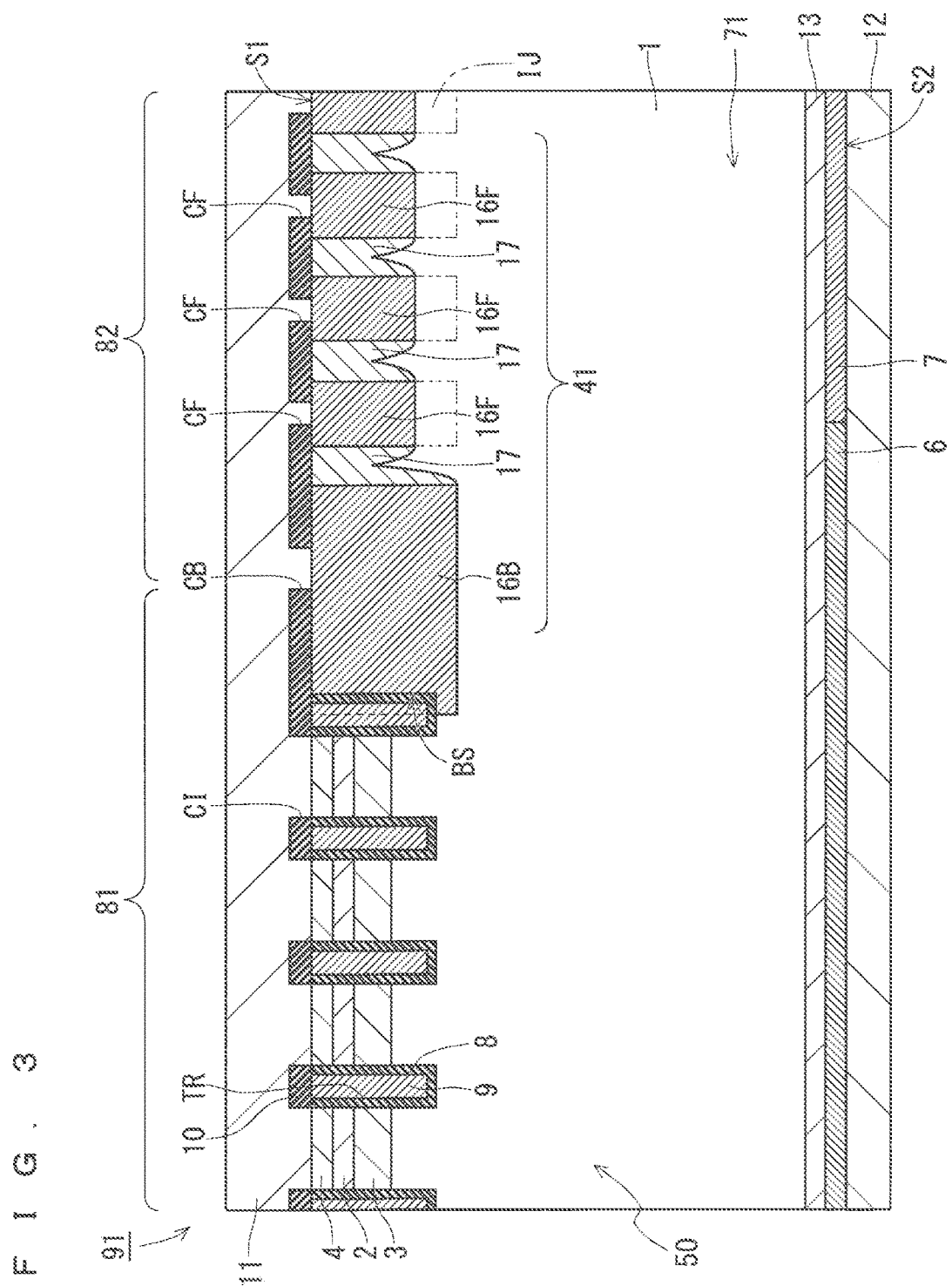
FIG. 3 is a schematic partial cross-sectional view taken along line III-III in FIG. 2.
Figure 4:
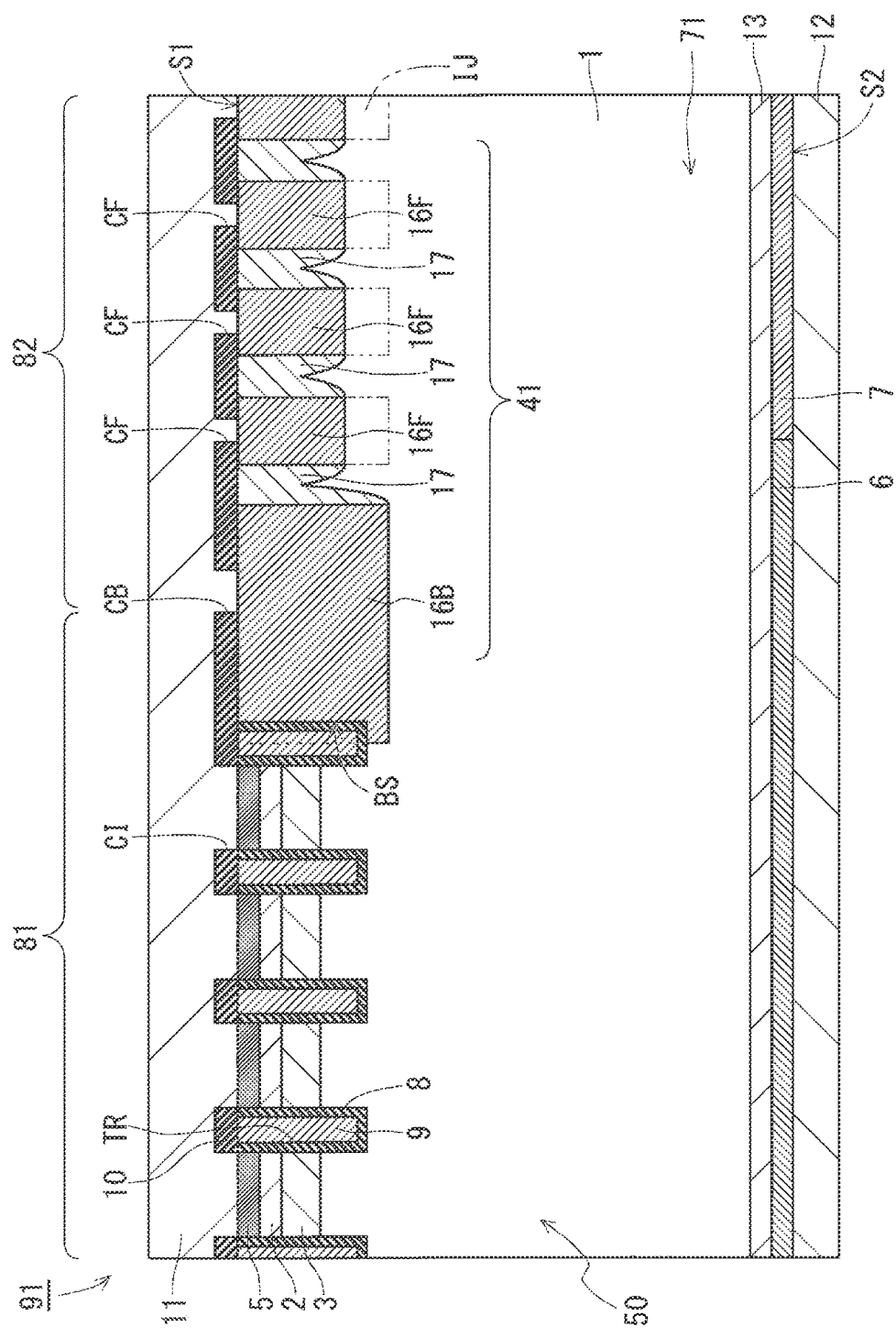
FIG. 4 is a schematic partial cross-sectional view taken along line IV-IV in FIG. 2.

FIG. 2 is a schematic partial plan view illustrating a structure of a broken-line portion II of the RC-IGBT 91 in FIG. 1. FIGS. 3 and 4 are schematic partial cross-sectional views taken respectively along lines III-III and IV-IV in FIG. 2. To facilitate viewing, part of the structure that is located in the upper part in FIGS. 3 and 4 is not illustrated in FIG. 2. Referring to FIGS. 2 to 4, the RC-IGBT 91 includes a semiconductor substrate 71, a gate oxide film 8 (gate insulating film), a trench electrode 9, an interlayer insulating film 10, an emitter electrode 11 (first electrode), and a collector electrode 12 (second electrode).

The semiconductor substrate 71 has a top surface S1 (first surface) and a back surface S2 (second surface opposite the first surface). The top surface S1 and the back surface S2 each have a portion included in the IGBT region 81 and a portion included in the FWD region 82. The semiconductor substrate 71 includes an n$^+$ emitter layer 4 (first layer) of an n type (first conductivity type), a p$^+$ contact layer 5 (second layer) of a p type (second conductivity type different from the first conductivity type), a p base layer 2 (third layer) of the p type, a p layer 41 (fourth layer) of the p type, an n layer 50 (fifth layer) of the n type, a p$^+$ collector layer 6 (sixth layer) of the p type, and an n$^+$ cathode layer 7 (seventh layer) of the n type.

The n$^+$ emitter layer 4 is provided on the top surface S1 and away from the back surface S2 in the IGBT region 81. The p$^+$ contact layer 5 is provided on the back surface S2 and away from the top surface S1 in the IGBT region 81. The p base layer 2 is provided away from the top surface S1 and the back surface S2 in the IGBT region 81. The p base layer 2 is in contact with the n$^+$ emitter layer 4 and the p$^+$ contact layer 5. The p layer 41 has a portion included in the FWD region 82 and is provided on the top surface S1 and away from the back surface S2. The n layer 50 is in contact with the p base layer 2 in the IGBT region 81 and in contact with the p layer 41 in the FWD region 82. The p$^+$ collector layer 6 and the n$^+$ cathode layer 7 are provided on the back surface S2 and are in contact with the n layer 50. The p$^+$ collector layer 6 is at least partially included in the IGBT region 81, and the n$^+$ cathode layer 7 is at least partially included in the FWD region 82.

The n layer 50 includes an n$^-$ drift layer 1. A portion of the n layer 50 that is in contact with the p base layer 2 is preferably a carrier storing layer 3 that has a higher impurity concentration than that of the n$^-$ drift layer 1. A portion of the n layer 50 that is in contact with the p$^+$ collector layer 6 or the n$^+$ cathode layer 7 is preferably a buffer layer 13 that has a higher impurity concentration than that of the n$^-$ drift layer 1.

The top surface S1 of the semiconductor substrate 71 is provided with a plurality of trenches TR each having a side wall. The trenches TR include gate trenches and a boundary trench (the right-most trench among the trenches TR in FIG. 3 or 4) disposed between the gate trenches and the FWD region 82. The gate trenches each have a gate side wall having a channel surface formed of the n+ emitter layer 4, the p base layer 2, and the n layer 50, as a side wall. The boundary trench has a boundary side wall BS (the right-side wall in FIG. 3 or 4) that faces the FWD region 82 as a side wall.

The gate oxide film 8 covers the side walls of the trenches TR. The trench electrode 9 is provided in the trenches TR via the gate oxide film 8. The trench electrode 9 is made of, for example, polysilicon.

The interlayer insulating film 10 is provided on the top surface S1 of the semiconductor substrate 71. The interlayer insulating film 10 has IGBT contact holes CI (IGBT openings) that expose the n+ emitter layer 4 and the p+ contact layer 5, and diode contact holes CF and CB (diode openings) that expose part of the p layer 41.

The emitter electrode 11 is provided on the interlayer insulating film 10. The emitter electrode 11 is in contact with the n+ emitter layer 4 and the p+ contact layer 5 through the IGBT contact holes CI and is in contact with the p layer 41 through the diode contact holes CF and CB.

The collector electrode 12 is provided on the back surface S2 of the semiconductor substrate 71. The collector electrode 12 is in contact with the p+ collector layer 6 and the n+ cathode layer 7.

The p layer 41 includes a trench-covering well region 16B, a plurality of isolated well regions 16F, and a diffusion region 17. The trench-covering well region 16B covers the deepest part of the boundary side wall BS (the side wall of the right-most trench TR in FIG. 3 or 4) of the aforementioned boundary trench. In other words, the trench-covering well region 16B covers a corner portion of the boundary trench on the FWD region side. The isolated well regions 16F are each disposed separately from the trench-covering well region 16B. The isolated well regions 16F are also spaced from one another. The width (lateral dimension in FIG. 3 or 4) of each isolated well region 16F is smaller than that of the trench-covering well region 16B. The diffusion region 17 connects the trench-covering well region 16B and the isolated well regions 16F. The p layer 41 is preferably formed on the entire top surface S1 in the FWD region 82.

When impurity concentrations in a direction parallel to the top surface S1 of the semiconductor substrate 71 are compared, the diffusion region 17 has a lower impurity concentration than those of the trench-covering well region 16B and the isolated well regions 16F. Thus, the impurity concentration of the p layer 41 at the top surface S1 varies.

The diode contact holes CF and CB of the interlayer insulating film 10 respectively expose the isolated well regions 16F and the trench-covering well region 16B. With this structure, the emitter electrode 11 is in contact with only the isolated well regions 16F and the trench-covering well region 16B of the p layer 41 and is away from the diffusion region 17.

Next, a method of manufacturing the RC-IGBT 91, and in particular, the process of forming the p layer 41 will be described below.

First, ion-implanted regions IJ are formed by selectively implanting impurity ions into the top surface S1 of the semiconductor substrate 71. The positions of the ion-implanted regions IJ on the top surface S1 correspond to the positions of the trench-covering well region 16B and the isolated well regions 16F. The depth of the ion-implanted region IJ that corresponds to the trench-covering well region 16B and the depth of the ion-implanted regions IJ that correspond to the isolated well regions 16F are approximately the same at the time immediately after the ion implantation.

The above-described formation of the ion-implanted regions IJ can be performed collectively by using an implantation mask that is formed using common lithographic technology. The ions implanted are boron, for example.

Next, the implanted impurities are diffused by heat treatment. This diffusion occurs in the direction parallel to the top surface S1 (lateral direction in FIGS. 3 and 4) and in the depth direction perpendicular to the former direction. This results in the formation of the trench-covering well region 16B and the isolated well regions 16F that are shallower than the trench-covering well region 16B. The diffusion occurring in the direction parallel to the top surface S1 also results in the formation of the diffusion region 17 having a relatively low impurity concentration between the ion-implanted regions IJ, and reduces the impurity concentration of the isolated well regions 16F. Here, the width (lateral dimension in FIGS. 3 and 4) of the trench-covering well region 16B is sufficiently greater than the width of each isolated well region 16F. This suppresses a reduction in the impurity concentration of the trench-covering well region 16B due to the diffusion.

As described above, the trench-covering well region 16B located at the boundary between the IGBT region 81 and the FWD region 82, and the isolated well regions 16F and the diffusion region 17 that are located adjacent to the trench-covering well region 16B in the FWD region 82 and have lower impurity concentrations than that of the trench-covering well region 16B are collectively formed on the top surface S1 of the semiconductor substrate 71. Note that the diffusion region 17 is a region in which impurities are introduced by the diffusion rather than the ion implantation. Thus, when compared in the top surface S1, the impurity concentration of the diffusion region 17 is lower than those of the trench-covering well region 16B and the isolated well regions 16F.

The average impurity concentration of the isolated well regions 16F and the diffusion region 17 can be adjusted depending on the pattern of the ion-implanted regions IJ on the top surface S1, and in particular, can be adjusted depending on the dimension of the width of the pattern and the intervals in the pattern. The pattern adjustment allows the entire top surface S1 in the diode region 82 to be of the p type after the diffusion process. For example, when the average surface impurity concentration of the isolated well regions 16F and the diffusion region 17 is set to be $5 \times 10^{16}/cm^3$ on condition that the surface impurity concentration of the trench-covering well region 16B is $1 \times 10^{18}/cm^3$, the ratio of the isolated well regions 16F occupying the top surface S1 in the FWD region 82 can be set to 1/20. For example, when the isolated well regions 16F are disposed in the form of a square on the top surface S1, 1.0-μm-square isolated well regions 16F can be formed within a square with edges of $20^{1/2}$ μm ≈ 4.5 μm. The average impurity concentration of the isolated well regions 16F and the diffusion region 17 is preferably set to be greater than or equal to $1 \times 10^{16}/cm^3$ and less than or equal to $1 \times 10^{18}/cm^3$. In this case, it is possible to avoid problems such as a reduction in withstand voltage and to keep an appropriate balance between maintaining good recovery characteristics and suppressing a forward voltage drop.

According to the present preferred embodiment, the diffusion region 17 having a lower impurity concentration than those of the trench-covering well region 16B and the isolated well regions 16F is formed in the p layer 41. Consequently, the average impurity concentration of the p layer 41 is reduced as compared to the case where the p layer 41 as a whole is formed with only the impurity concentrations of the trench-covering well region 16B and the isolated well regions 16F. This suppresses the recovery current in the FWD region 82.

On the other hand, the emitter electrode 11 is disposed away from the diffusion region 17 having a lower impurity concentration, and is in contact with only the isolated well regions 16F and the trench-covering well region 16B that have higher impurity concentrations. This ensures good ohmic contact and prevents the forward voltage in the FWD region 82 from increasing due to a voltage drop in a portion of contact between the emitter electrode 11 and a portion of the p layer 41 that has a low impurity concentration (specifically, the diffusion region 17).

From the above, the FWD region 82 can combine both a low forward voltage and a low recovery current. Using this FWD region 82 as a free-wheeling diode of the IGBT region 81 can reduce the switching loss of the RC-IGBT 91.

Note that the effect of the trench-covering well region 16B preventing dielectric breakdown in the corner portion of the boundary trench (the lower-right corner portion of the rightmost trench TR in FIG. 3 or 4) will be reduced if the impurity concentration of the trench-covering well region 16B is too low. In addition, if the trenches TR are covered with such a trench-covering well region 16B that has a low impurity concentration, the time of heat treatment for diffusing impurities will increase and manufacturing efficiency will considerably decrease. In contrast, the present preferred embodiment can maintain a high impurity concentration of the trench-covering well region 16B.

Moreover, the emitter electrode 11 is disposed away from the diffusion region 17 having a relatively low impurity concentration as described above. This eliminates places where the contact resistance is high, thus reducing the possibility of local heat generation due to the presence of such places. It is thus possible to prevent the occurrence of operational problems due to heat generation and to improve the reliability of the RC-IGBT 91.

The $p^+$ collector layer 6 (FIGS. 3 and 4) preferably has a portion that extends from the IGBT region 81 into the FWD region 82. More specifically, the $p^+$ collector layer 6 preferably has a portion that faces the diffusion region 17 in the depth direction of the semiconductor substrate 71, and may further have a portion that faces the isolated well regions 16F. This reduces the possibility that the trench-covering well region 16B may function as a parasitic diode. It is thus possible to improve the recovery characteristics of the FWD region 82.

With the method of manufacturing the RC-IGBT 91 according to the present preferred embodiment, the trench-covering well region 16B, the isolated well regions 16F, and the diffusion region 17 are collectively formed by selective ion implantation and diffusion performed on the top surface S1. Thus, the structure can be formed at a low cost.

Second Preferred Embodiment

Figure 6:
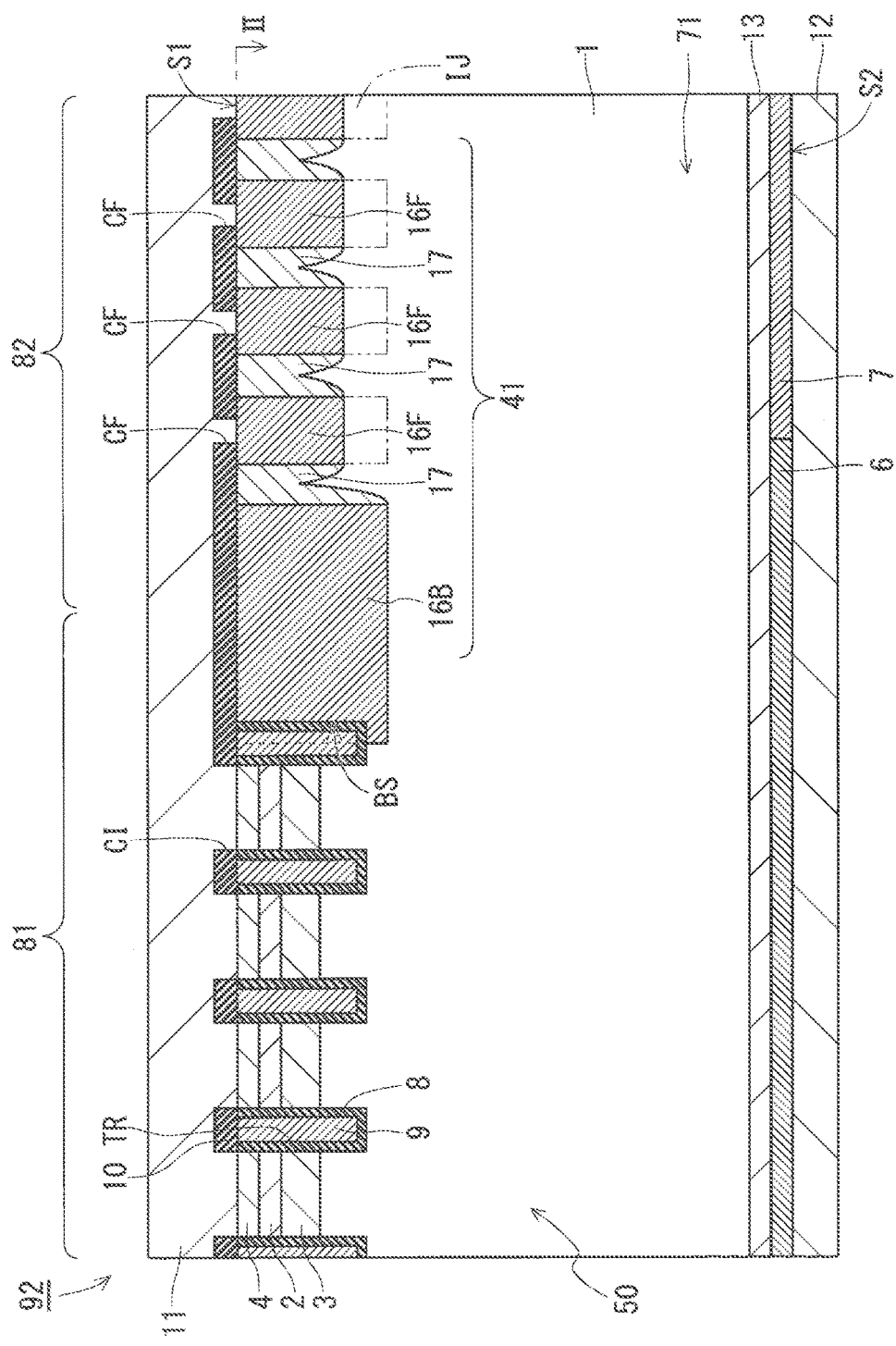
FIG. 6 is a schematic partial cross-sectional view taken along line VI-VI in FIG. 5.
Figure 7:
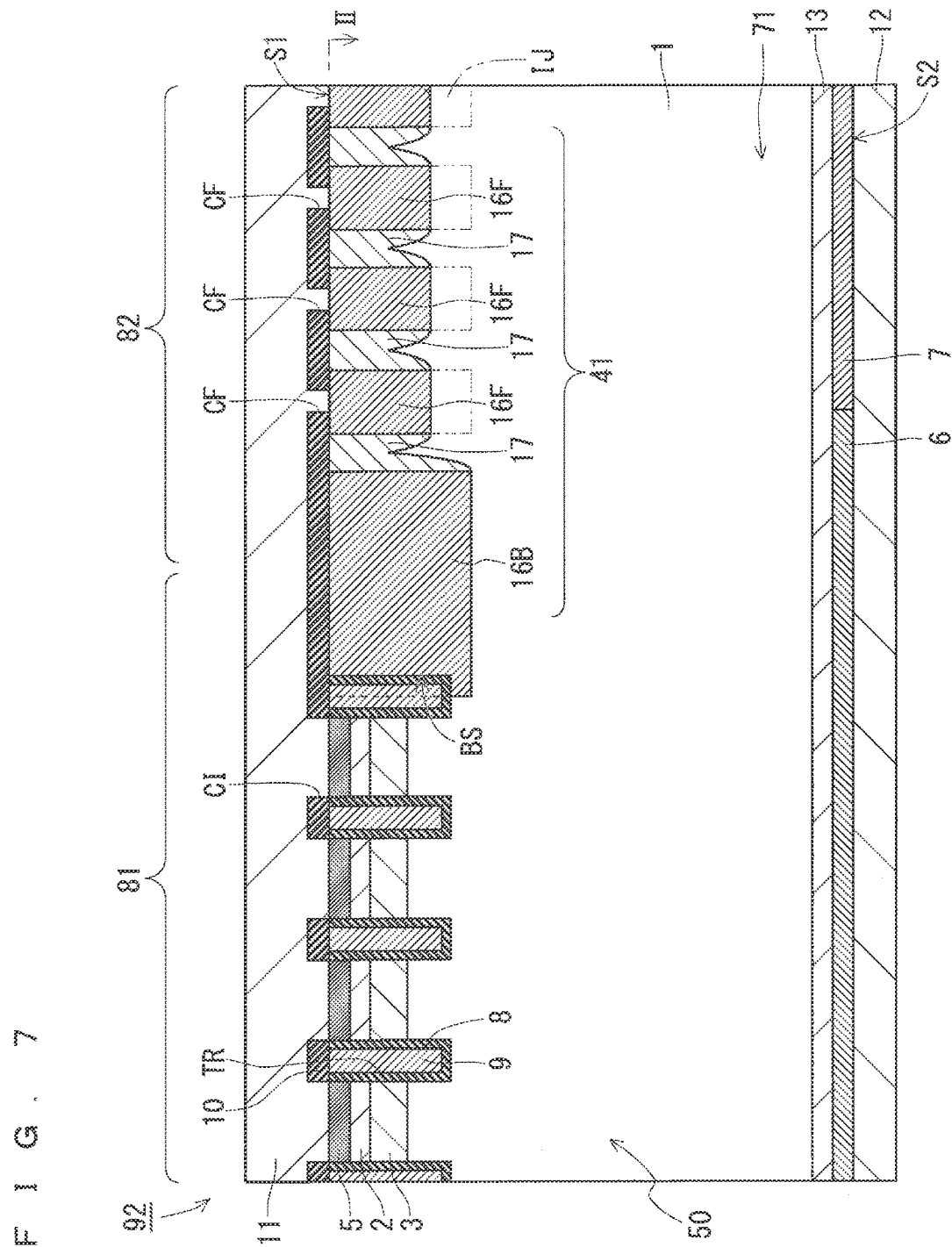
FIG. 7 is a schematic partial cross-sectional view taken along line VII-VII in FIG. 5.

Referring to FIGS. 5 to 7, in an RC-IGBT 92 according to the present preferred embodiment, the emitter electrode 11 is in contact with only the isolated well regions 16F of the p layer 41. In other words, the interlayer insulating film 10 has no diode contact hole CB (FIGS. 3 and 4) that exposes the trench-covering well region 16B. The other constituent elements are substantially the same as those of the above-described first preferred embodiment. Thus, constituent elements that are the same as or correspond to those of the first preferred embodiment are given the same reference numerals, and redundant descriptions thereof will be omitted.

The present preferred embodiment can achieve substantially the same effect as that of the first preferred embodiment. In addition, unlike the first preferred embodiment, the second preferred embodiment can further reduce the recovery current because the emitter electrode 11 is not in contact with the trench-covering well region 16B, which has a higher impurity concentration than that of the isolated well regions 16F. It is thus possible to further reduce the switching loss due to the recovery current in the FWD region 82.

Third Preferred Embodiment

Figure 8:
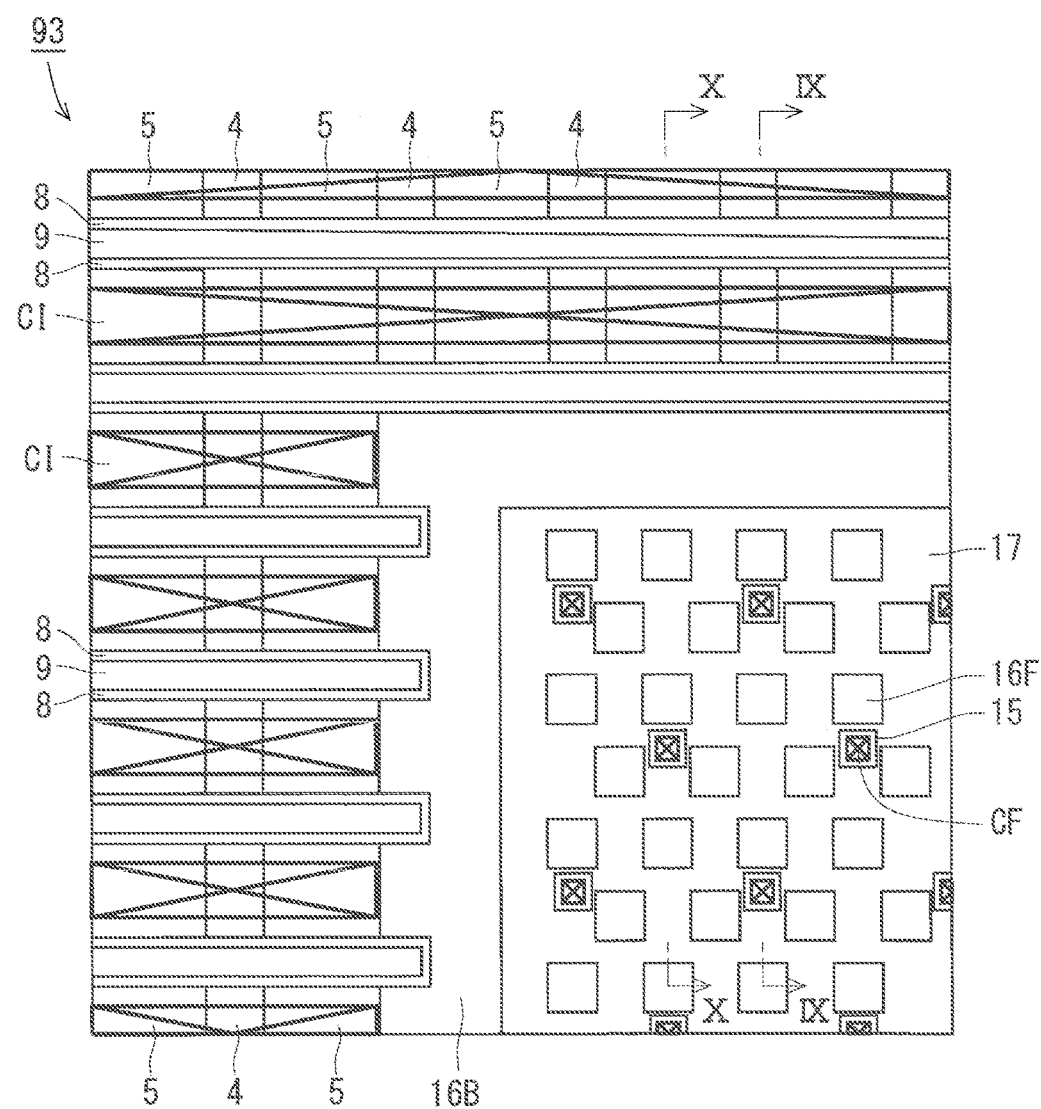
FIG. 8 is a partial plan view schematically illustrating a configuration of a power semiconductor device according to a third preferred embodiment of the present invention.
Figure 9:
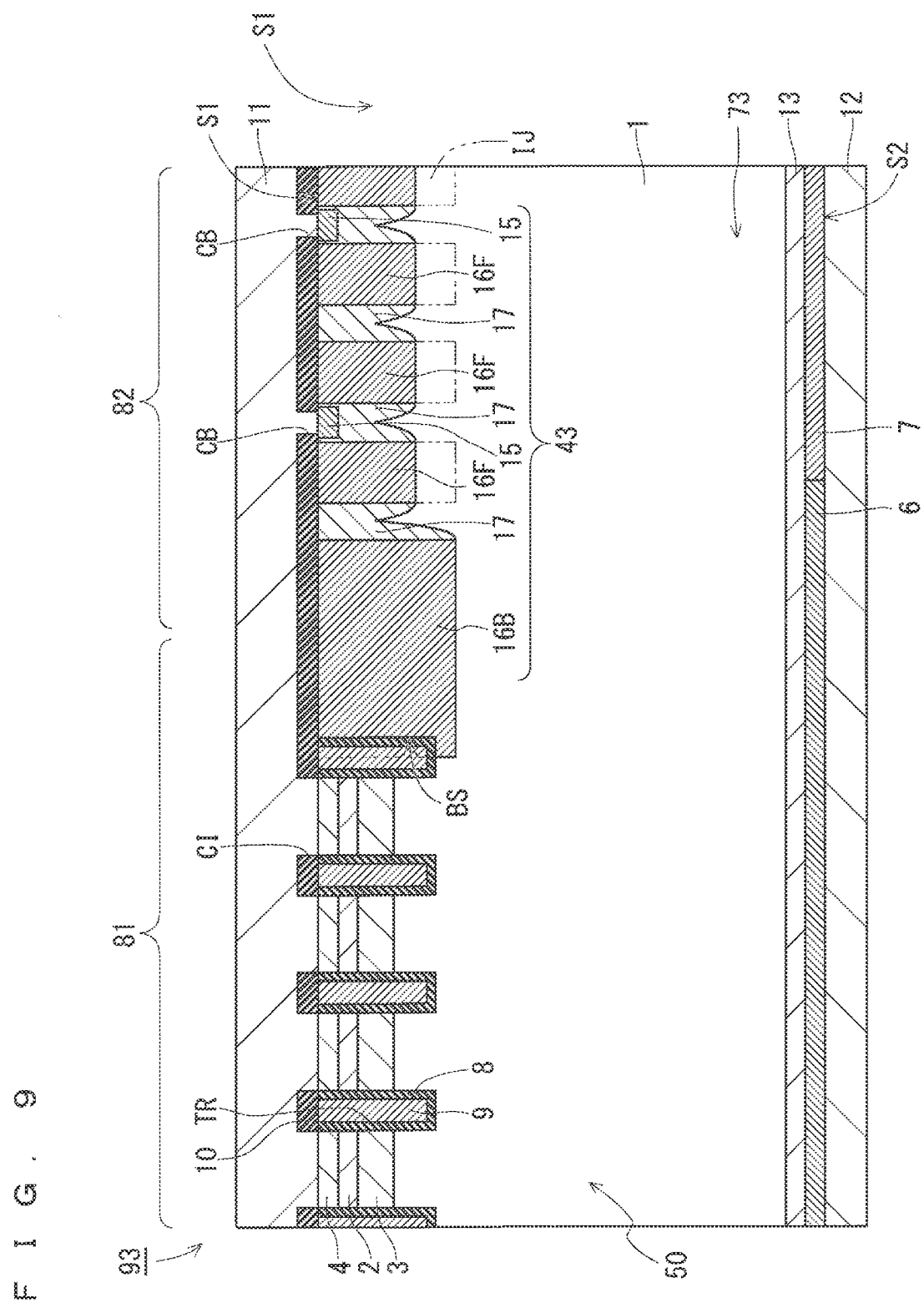
FIG. 9 is a schematic partial cross-sectional view taken along line IX-IX in FIG. 8.
Figure 10:
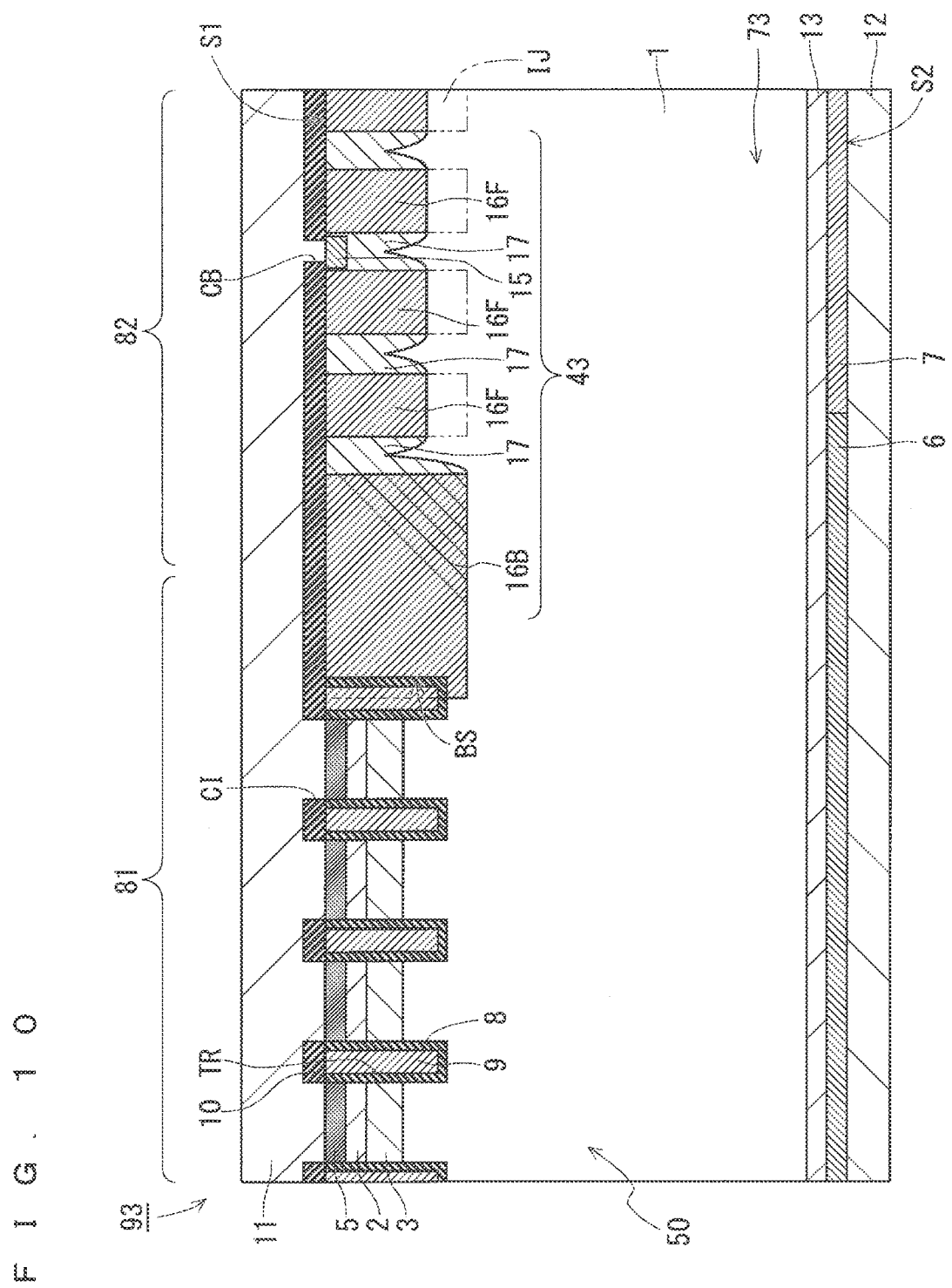
FIG. 10 is a schematic partial cross-sectional view taken along line X-X in FIG. 8.

Referring to FIGS. 8 to 10, in a semiconductor substrate 73 of an RC-IGBT 93 according to the present preferred embodiment, a p layer 43 includes a $p^+$ region 15 (high-impurity region) in addition to a trench-covering well region 16B, a plurality of isolated well regions 16F, and a diffusion region 17. When impurity concentrations in the direction parallel to the top surface S1 of the semiconductor substrate 73 are compared, the $p^+$ region 15 has a higher impurity concentration than those of the trench-covering well region 16B and the isolated well regions 16F. The emitter electrode 11 is in contact with only the $p^+$ region 15 of the p layer 43.

The p layer 43 is obtained by separately performing an ion implantation process for forming the $p^+$ region 15 in addition to the ion implantation process for forming the p layer 41 according to the first preferred embodiment. An ion-implanted region for forming the $p^+$ region 15 is disposed so as to not overlap with the ion-implanted regions for forming the trench-covering well region 16B and the isolated well regions 16F. Thus, the $p^+$ region 15 is disposed on the diffusion region 17 and away from the trench-covering well region 16B and the isolated well regions 16F in the p layer 43.

Note that constituent elements other than those described above are substantially the same as those of the above-described first and second embodiments. Thus, constituent elements that are the same as or correspond to those of the first and second preferred embodiments are given the same reference numerals, and redundant descriptions thereof will be omitted.

According to the present preferred embodiment, the diffusion region 17 having a lower impurity concentration than those of the trench-covering well region 16B and the isolated well regions 16F are formed in the p layer 43. Consequently, the average impurity concentration of the p layer 43 is reduced as compared to the case where the p layer 43 as a whole is formed with the impurity concentrations of only the trench-covering well region 16B or the isolated well regions 16F. This suppresses the recovery current in the FWD region 82. On the other hand, the emitter electrode 11 is in contact with only the $p^+$ region 15 of the p layer 43. This prevents the forward voltage in the FWD region 82 from increasing due to a voltage drop at a contact between the emitter electrode 11 and a portion of the p layer 43 that has a low impurity concentration. From the above, the FWD region 82 can combine both a low forward voltage and a low recovery current. Using this FWD region 82 as a free-wheeling diode of the IGBT region 81 can reduce the switching loss of the RC-IGBT 93.

Moreover, according to the present preferred embodiment, the trench-covering well region 16B or the isolated well regions 16F do not overlap with the $p^+$ region 15. This prevents the formation of a portion where the impurity concentration locally exceeds the impurity concentration of the $p^+$ region 15. It is thus possible to improve the recovery characteristics.

Fourth Preferred Embodiment

Figure 11:
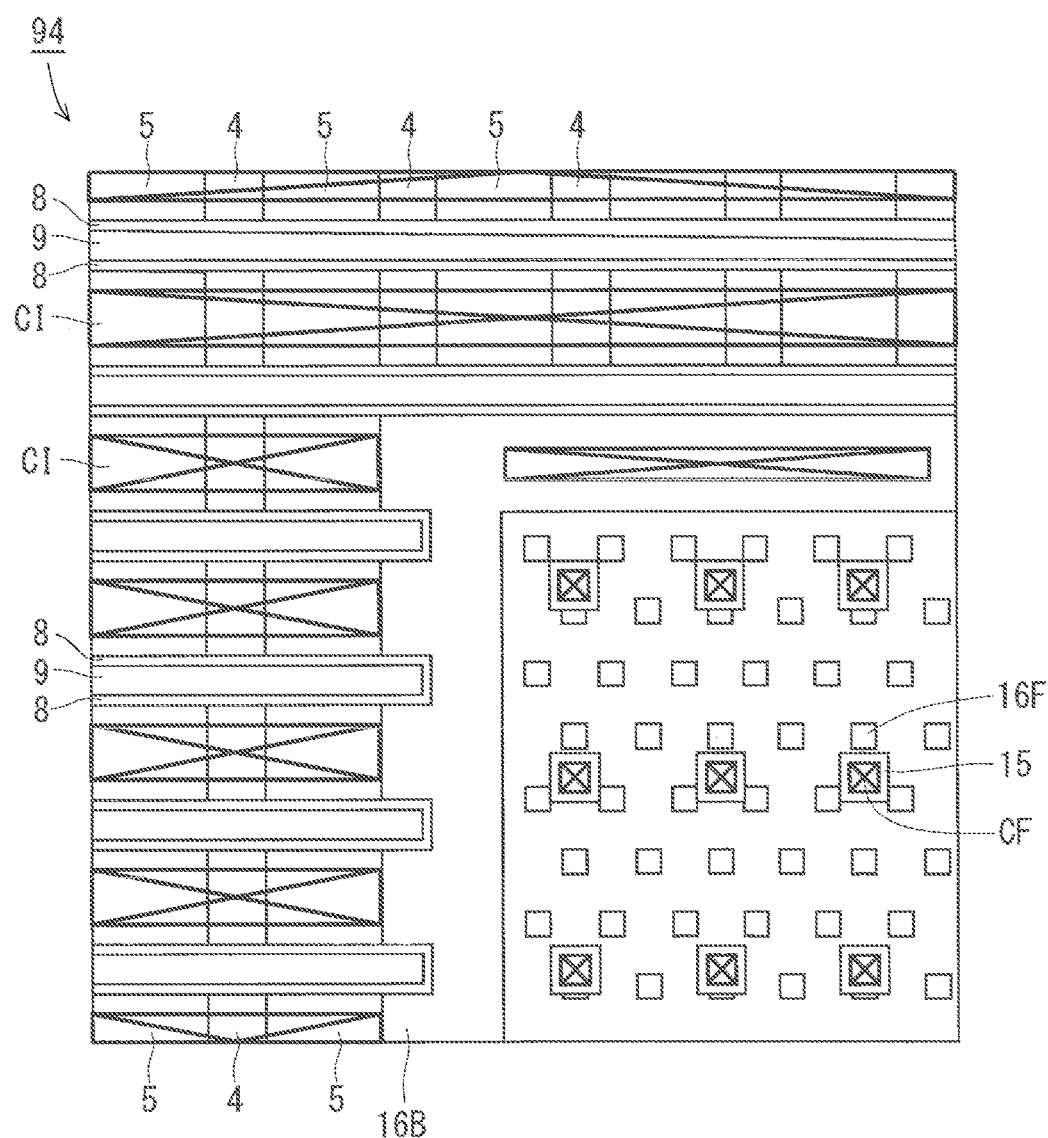
FIG. 11 is a partial plan view schematically illustrating a configuration of a power semiconductor device according to a fourth preferred embodiment of the present invention.

Referring to FIG. 11, in an RC-IGBT 94 according to the present preferred embodiment, the $p^+$ region 15 includes portions that are in contact with the trench-covering well region 16B and the isolated well regions 16F. In other words, the ion-implanted region for forming the p$^+$ region 15 has portions that overlap with the ion-implanted regions for forming the trench-covering well region 16B and the isolated well regions 16F during manufacture of the RC-IGBT 94.

Note that constituent elements other than those described above are substantially the same as those of the above-described third preferred embodiment. Thus, constituent elements that are the same as or correspond to those of the third preferred embodiment are given the same reference numerals, and redundant descriptions thereof will be omitted.

Like the third preferred embodiment, the present preferred embodiment can also reduce the switching loss. In addition, unlike the third preferred embodiment, the fourth preferred embodiment has no limitations such as the need to dispose the p$^+$ region 15 and the trench-covering well region 16B or the isolated well regions 16F on the top surface S1 without overlapping. This increases the degree of flexibility in the layout of each region. In FIG. 11, for example, the arrangement pattern of the p$^+$ region 15 on the top surface S1 corresponds to the vertices of rectangles, and there is found no specific relationship with the arrangement pattern of the isolated well regions 16F.

Note that the interval of the isolated well regions 16F in FIG. 11 is made smaller than that in FIG. 8. Moreover, the isolated well regions 16F are arranged in a hexagonal closest packed configuration on the top surface S1 of the semiconductor substrate 73. This reduces the cycle of change in impurity concentration on the top surface of the semiconductor substrate in the FWD region 82, thus increasing the uniformity of the distribution of impurity concentrations in the top surface S1. It is thus possible to improve the recovery characteristics.

Fifth Preferred Embodiment

Figure 13:
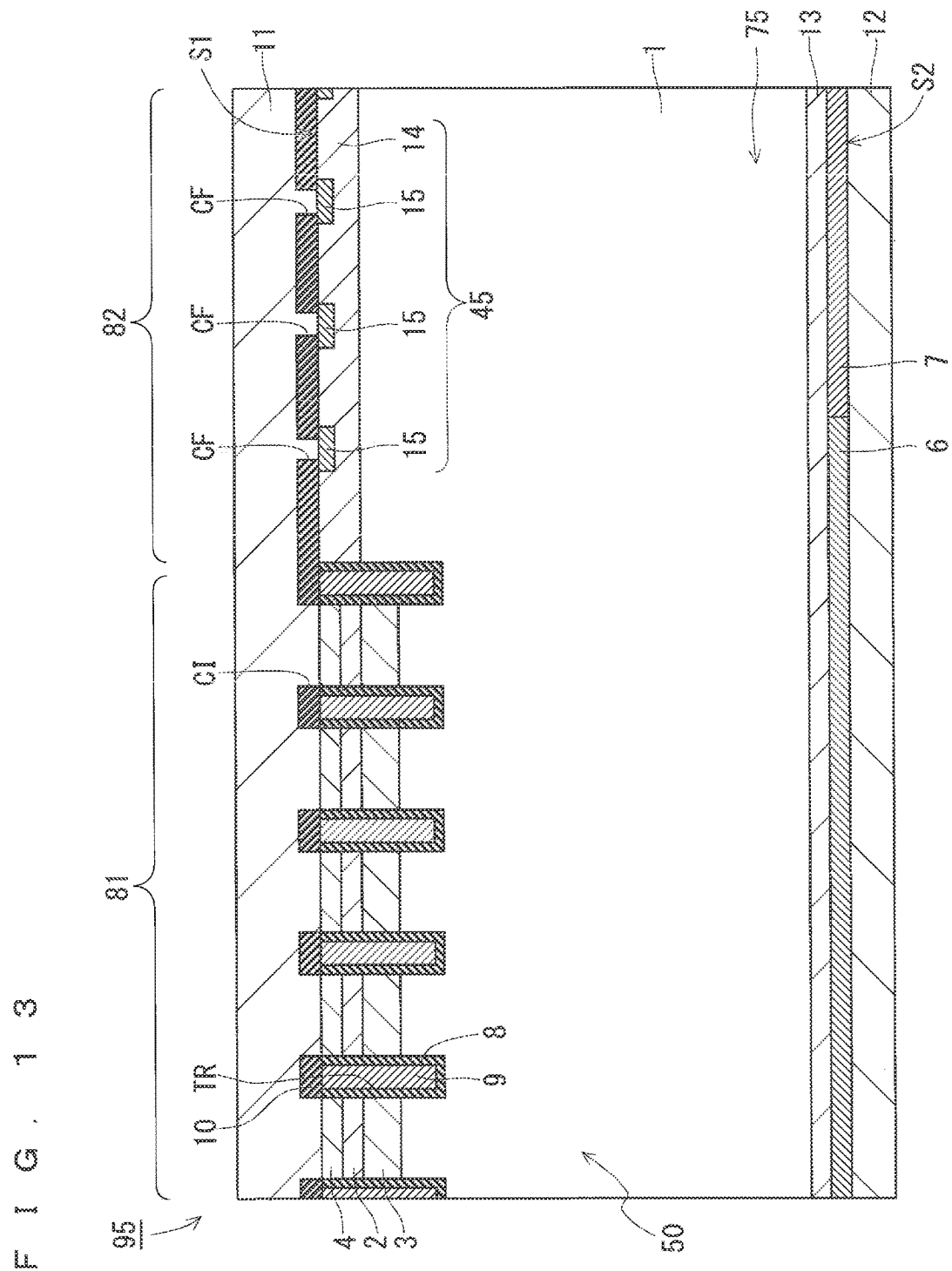
FIG. 13 is a schematic partial cross-sectional view taken along line XIII-XIII in FIG. 12.
Figure 14:
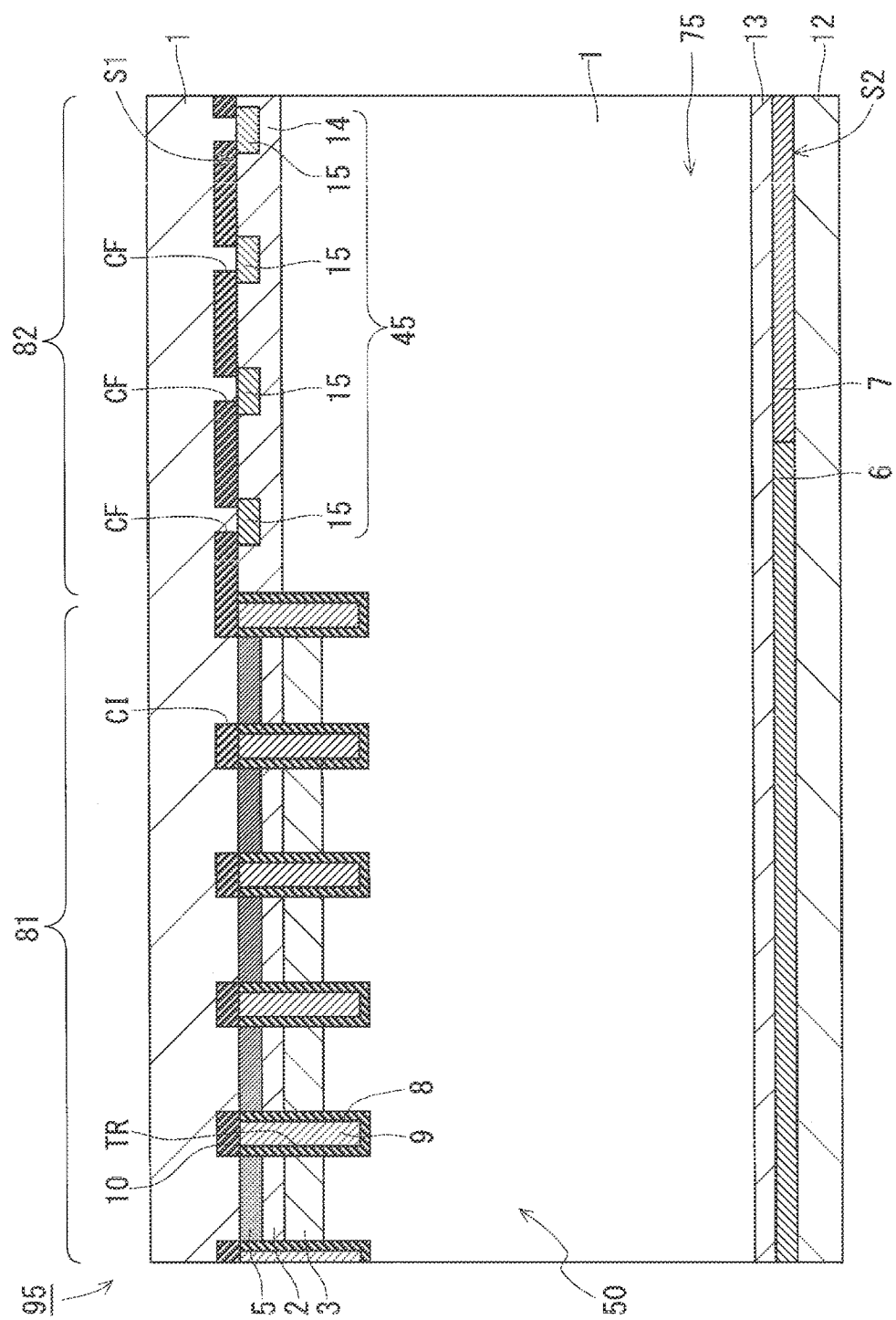
FIG. 14 is a schematic partial cross-sectional view taken along line XIV-XIV in FIG. 12.

Referring to FIGS. 12 to 14, a semiconductor substrate 75 of an RC-IGBT 95 according to the present preferred embodiment includes an n$^+$ cathode layer 7 (first layer), an n layer 50 (second layer), and a p layer 45 (third layer).

The p layer 45 is provided on the top surface S1 and away from the back surface S2. The p layer 45 is at least partially included in the FWD region 82 and is in contact with the n layer 50. The p layer 45 includes a p region 14 (first region) and a plurality of p$^+$ regions 15 (second regions). The p region 14 is provided on the entire top surface S1 in the FWD region 82. The p region 14 may be collectively formed together with the p base layer 2. The p$^+$ regions 15 are spaced from one another on the p region 14. When impurity concentrations in the direction parallel to the top surface S1 of the semiconductor substrate 75 are compared, the p$^+$ regions 15 have a higher impurity concentration than that of the p region 14.

The interlayer insulating film 10 is provided on the top surface S1 of the semiconductor substrate 75 and has diode contact holes CF that expose part of the p layer 45. The emitter electrode 11 is provided on the interlayer insulating film 10 and is in contact with the p layer 45 through the diode contact holes CF. The emitter electrode 11 is in contact with only the p$^+$ regions 15 of the p layer 45.

The average impurity concentration of the p layer 45 is desirably reduced to a value close to the impurity concentration of the p region 14. To achieve this, the ratio of the p$^+$ regions 15 occupying the p region 14 may be sufficiently reduced. The p$^+$ regions 15 are desirably arranged with small variations in distribution on the top surface S1, and for example, arranged in a hexagonal closest packed configuration as illustrated in FIG. 12.

Note that constituent elements other than those described above are substantially the same as those of the above-described first preferred embodiment. Thus, constituent elements that are the same as or correspond to those of the first preferred embodiment are given the same reference numerals, and redundant descriptions thereof will be omitted.

According to the present preferred embodiment, the p region 14 having a lower impurity concentration than that of the p$^+$ regions 15 is formed on the entire top surface S1 in the p layer 45 of the FWD region 82. Consequently, the p layer 45 can be formed with a low impurity concentration and high uniformity in the FWD region 82. This suppresses the recovery current in the FWD region 82.

On the other hand, the emitter electrode 11 is in contact with only the p$^+$ regions 15 of the p layer 45. This prevents the forward voltage in the FWD region 82 from increasing due to a voltage drop at a contact between the emitter electrode 11 and a portion of the p layer 45 that has a low impurity concentration.

From the above, the FWD region 82 can combine both a low forward voltage and a low recovery current. Using this FWD region 82 as a free-wheeling diode of the IGBT region 81 can reduce the switching loss of the RC-IGBT 95.

In addition, when the IGBT region 81 includes a plurality of cells, it is possible for cells that have other cells adjacent thereto to avoid a situation where they are adjacent to the n$^+$ cathode layer 7 on the back surface S2. In other words, no anode-short structures are formed. Thus, snapback does not occur during forward bias operation in the FWD region 82. It is thus possible to suppress an increase in steady-state loss due to snapback.

Sixth Preferred Embodiment

Figure 15:
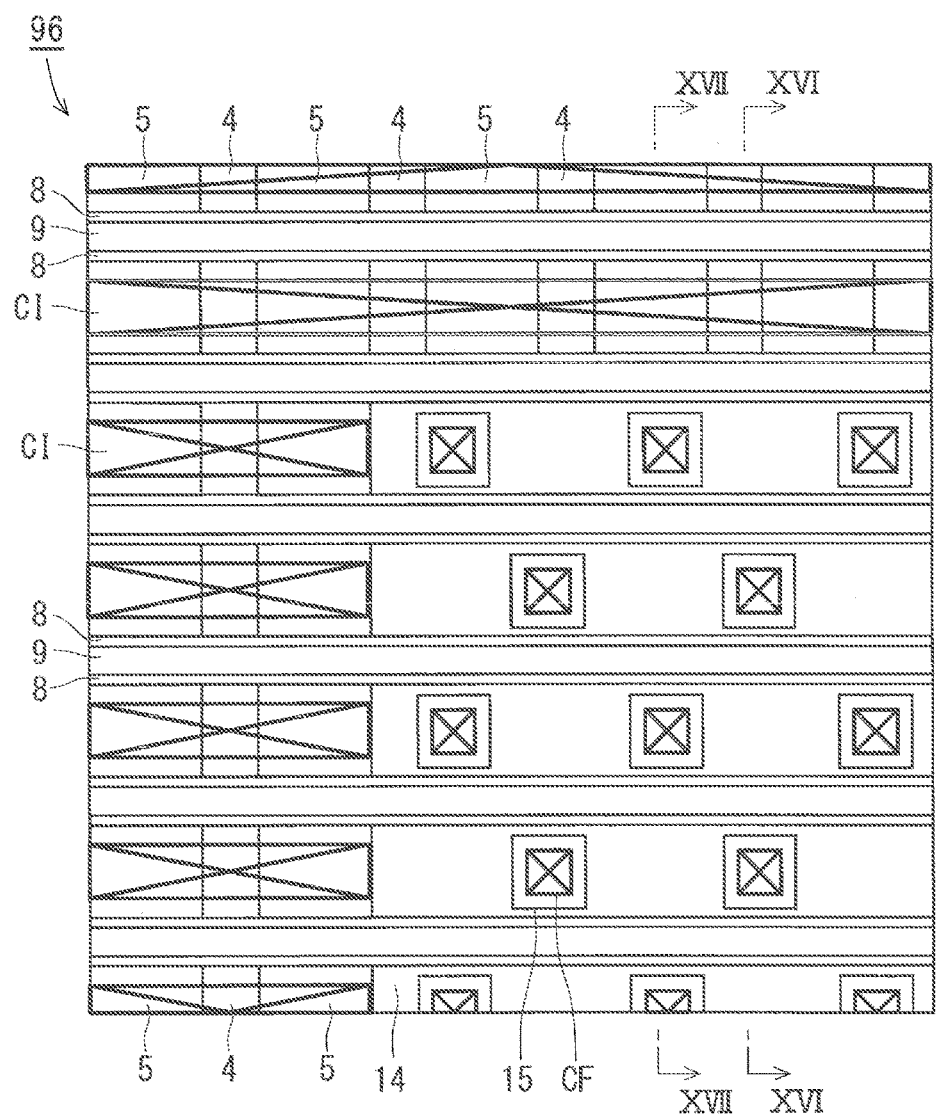
FIG. 15 is a partial plan view schematically illustrating a configuration of a power semiconductor device according to a sixth preferred embodiment of the present invention.
Figure 16:
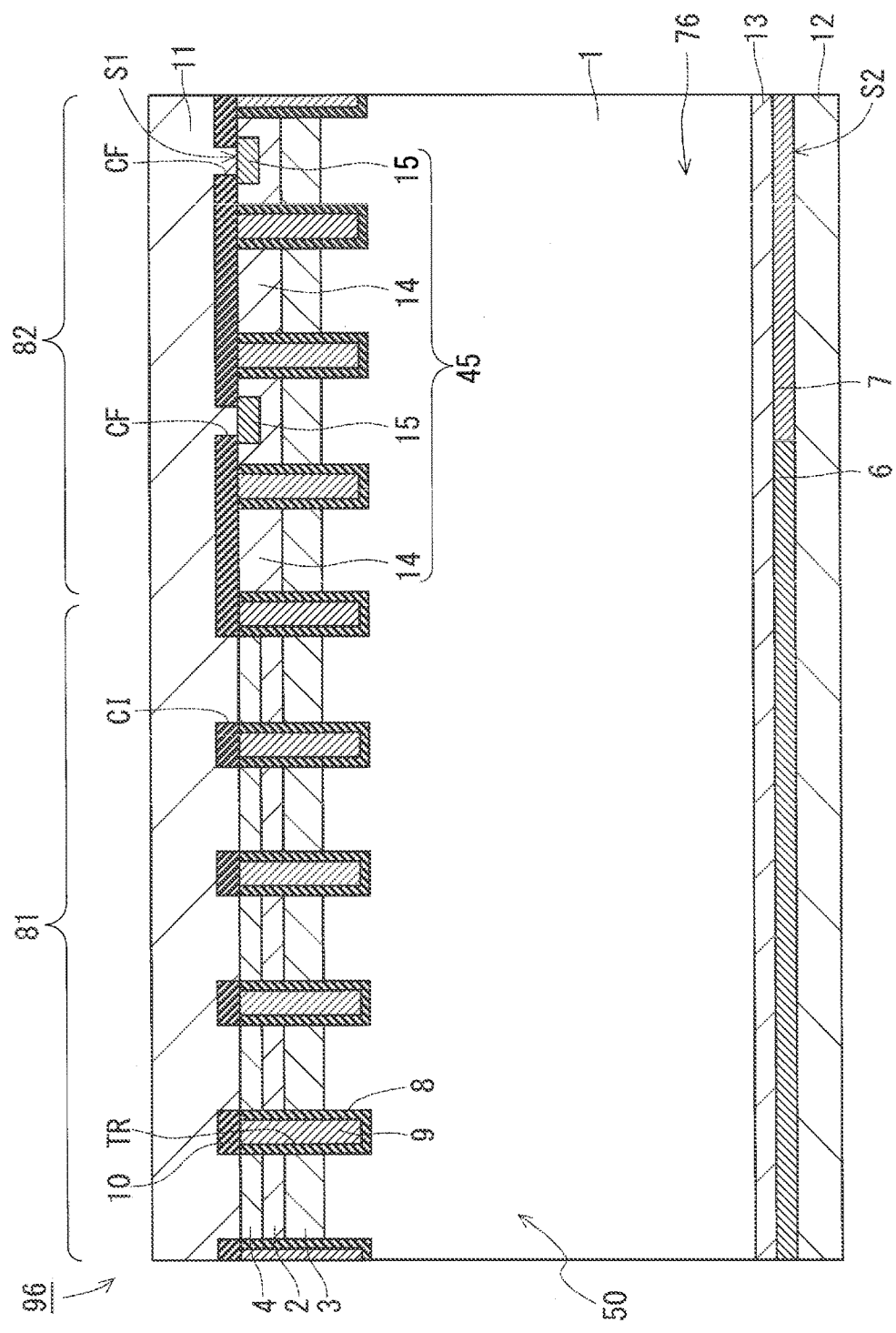
FIG. 16 is a schematic partial cross-sectional view taken along line XVI-XVI in FIG. 15.
Figure 17:
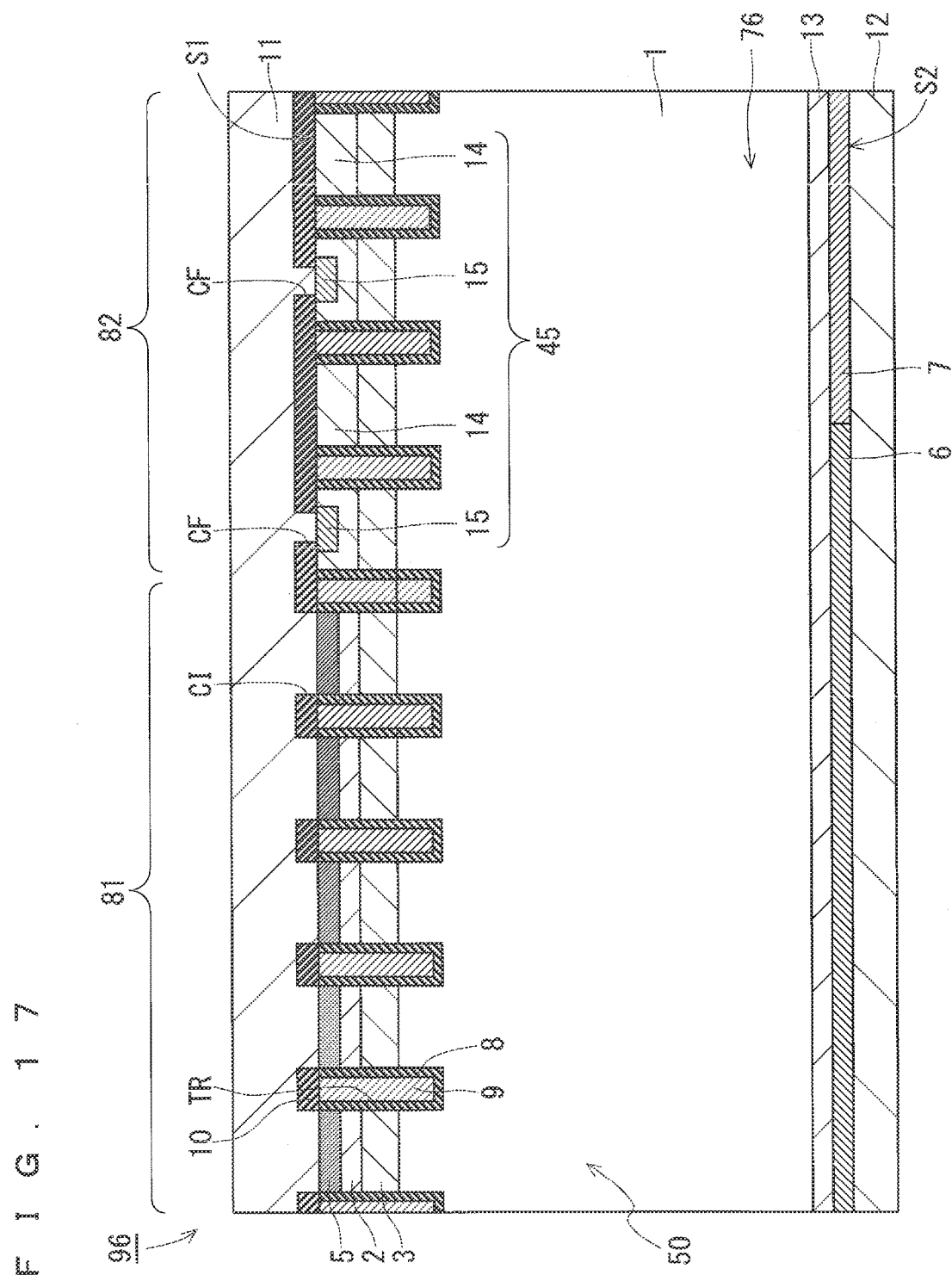
FIG. 17 is a schematic partial cross-sectional view taken along line XVII-XVII in FIG. 15.

Referring to FIGS. 15 to 17, a semiconductor substrate 76 of an RC-IGBT 96 according to the present preferred embodiment has trenches TR and a carrier storing layer 3 in not only the IGBT region 81 but also the FWD region 82. The p layer 45 is disposed on the carrier storing layer 3, and the trenches TR pass through both of these layers.

Note that constituent elements other than those described above are substantially the same as those of the above-described fifth preferred embodiment. Thus, constituent elements that are the same as or correspond to those of the fifth preferred embodiment are given the same reference numerals, and redundant descriptions thereof will be omitted.

According to the present preferred embodiment, the carrier storing layer 3 disposed under the p layer 45 can suppress the implantation of carriers from the p layer 45. This further suppresses the recovery current. In addition, the trenches TR formed in the FWD region 82 allows a high withstand voltage to be kept in a state in which the carrier storing layer 3 is disposed in the FWD region 82.

Seventh Preferred Embodiment

Figure 18:
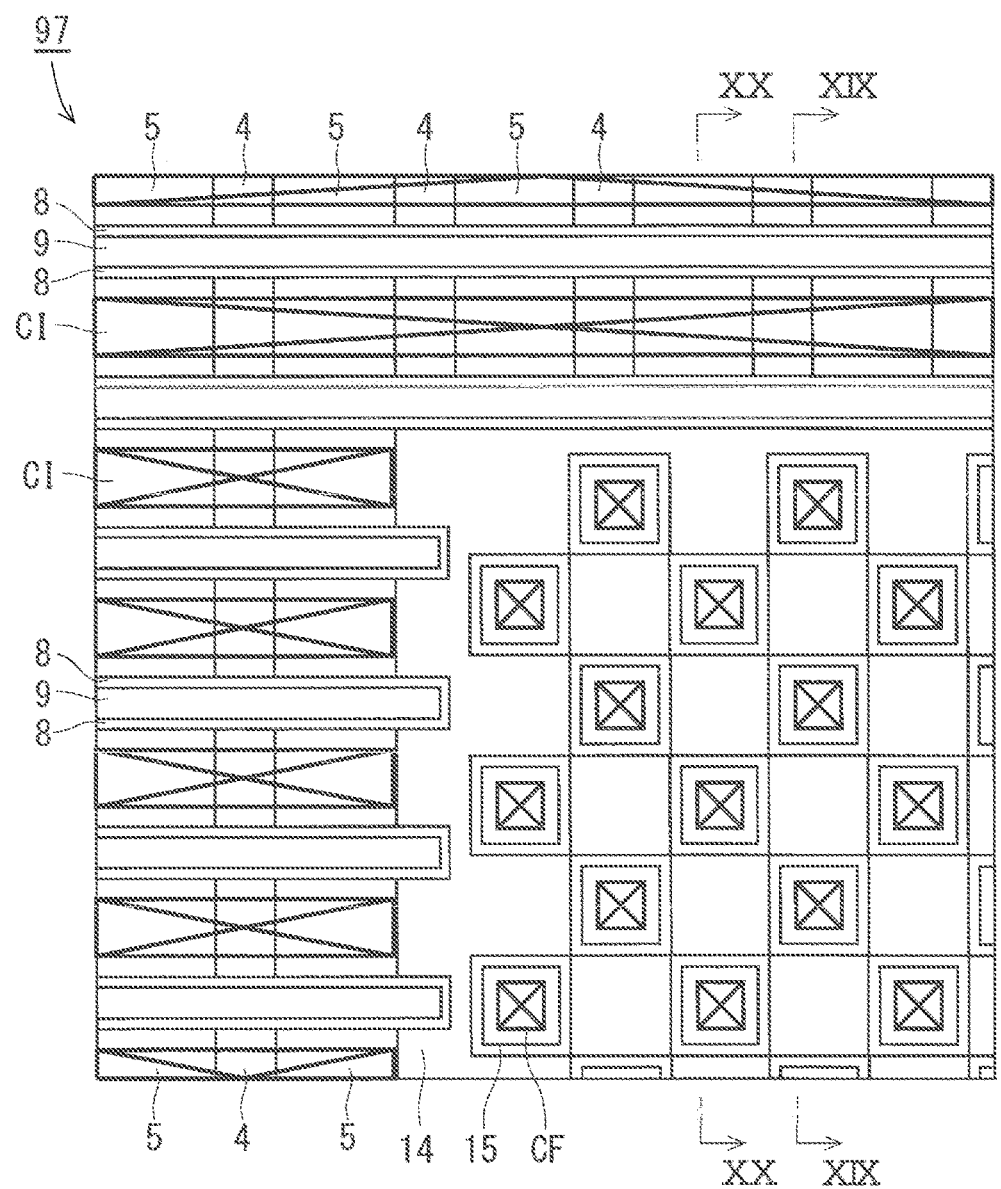
FIG. 18 is a partial plan view schematically illustrating a configuration of a power semiconductor device according to a seventh preferred embodiment of the present invention.
Figure 19:
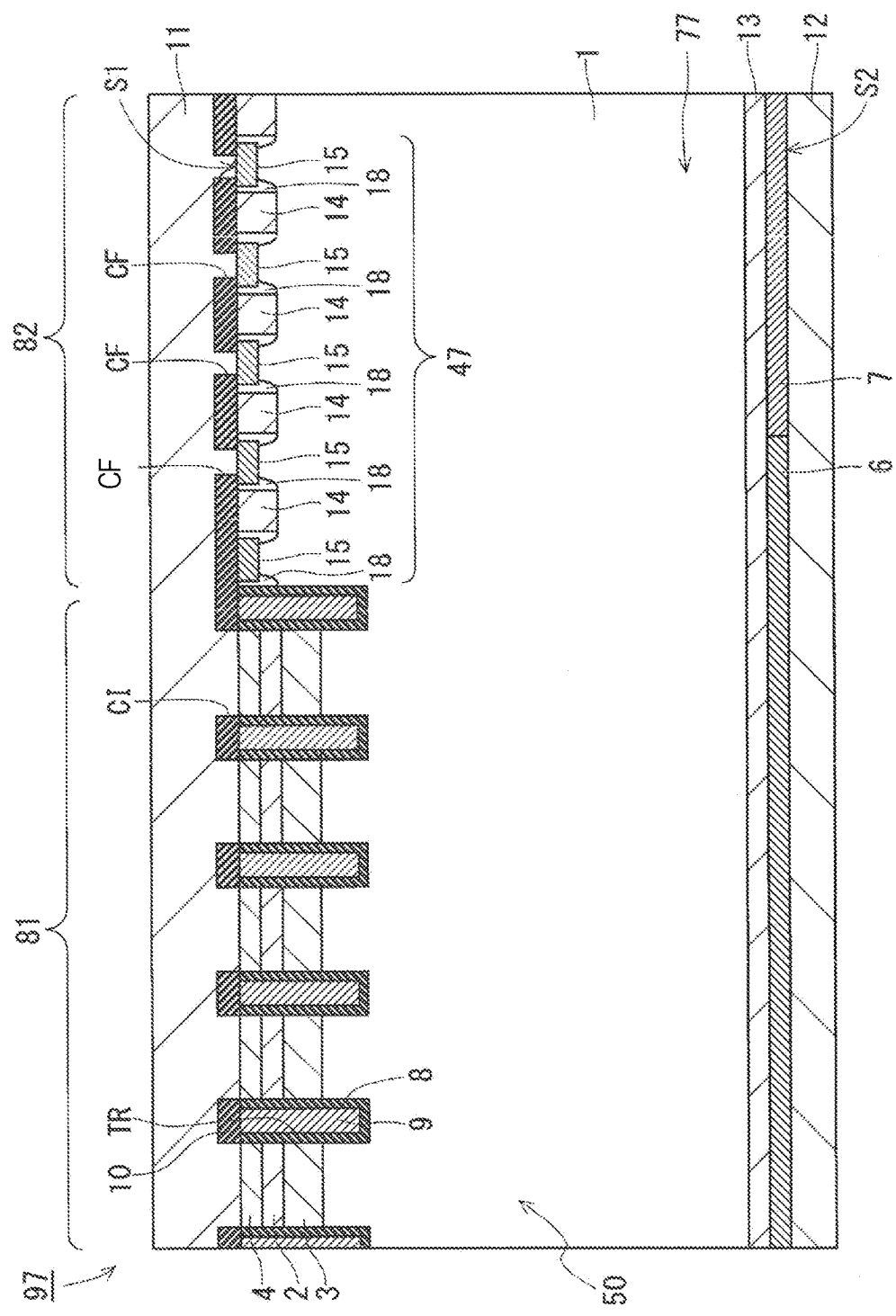
FIG. 19 is a schematic partial cross-sectional view taken along line XIX-XIX in FIG. 18.
Figure 20:
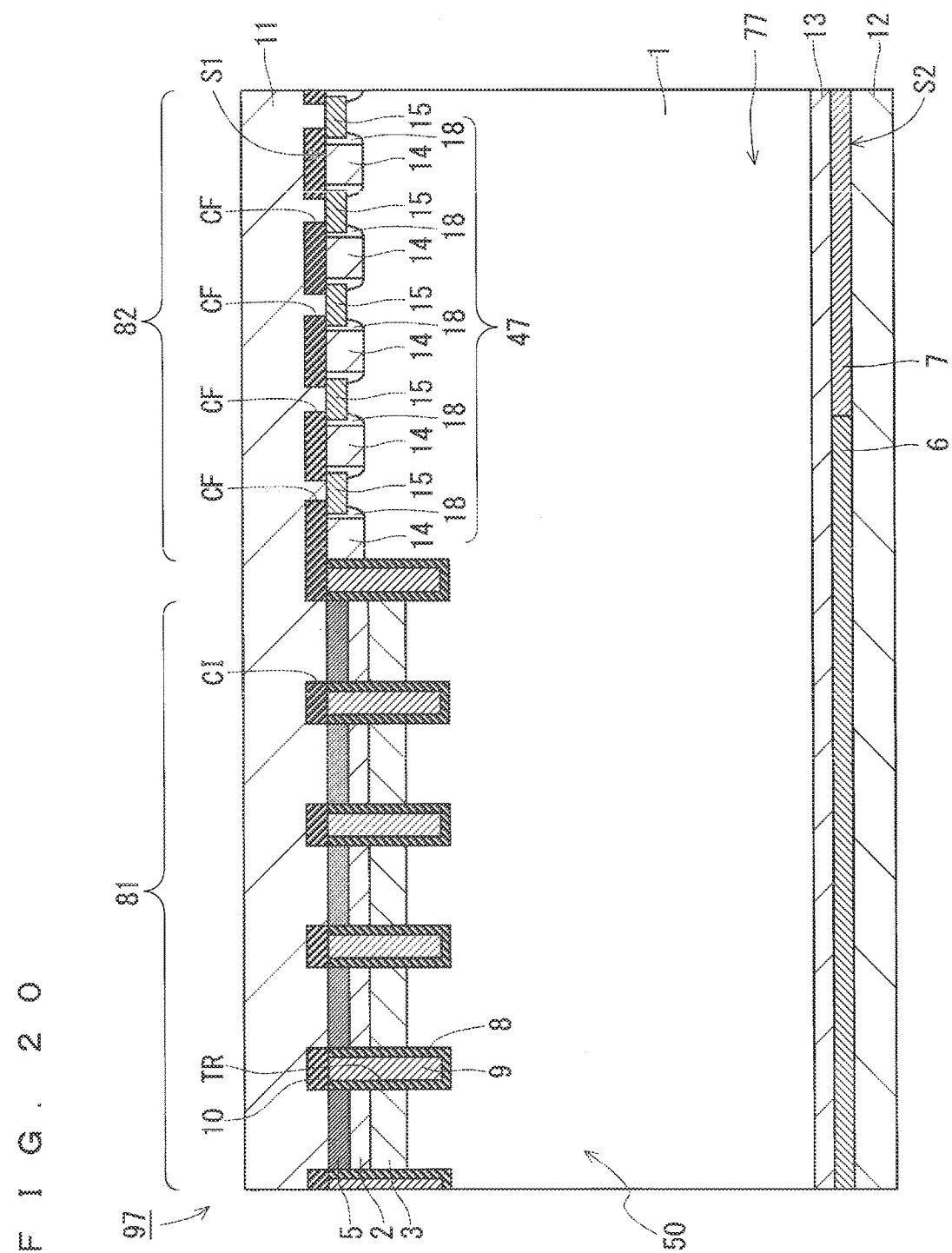
FIG. 20 is a schematic partial cross-sectional view taken along line XX-XX in FIG. 18.

Referring to FIGS. 18 to 20, in a semiconductor substrate 77 of an RC-IGBT 97 according to the present preferred embodiment, a p layer 47 includes a p region 14 (first region), a p$^+$ region 15 (second region) that is disposed away from the p region 14, and a diffusion region 18 that connects the p region 14 and the p$^+$ region 15. When impurity concentrations in the direction parallel to the top surface S1 of the semiconductor substrate 77 are compared, the diffusion region 18 has a lower impurity concentration than those of the p region 14 and the p⁺ region 15. The emitter electrode 11 is in contact with only the p⁺ region 15 of the p layer 47.

Note that constituent elements other than those described above are substantially the same as those of the above-described fifth preferred embodiment. Thus, constituent elements that are the same as or correspond to those of the fifth preferred embodiment are given the same reference numerals, and redundant descriptions thereof will be omitted.

According to the present preferred embodiment, the diffusion region 18 having a lower impurity concentration than those of the p region 14 and the p⁺ region 15 is formed in the p layer 47. Consequently, the average impurity concentration of the p layer 47 is reduced as compared to the case where the p layer 47 as a whole is formed with only the impurity concentrations of the p region 14 or the p⁺ region 15. This suppresses the recovery current in the FWD region 82. On the other hand, the emitter electrode 11 is in contact with only the second impurity region of the p layer 47. This prevents the forward voltage in the FWD region 82 from increasing due to a voltage drop at a contact between the emitter electrode 11 and a portion of the p layer 47 that has a low impurity concentration. From the above, the FWD region 82 can combine both a low forward voltage and a low recovery current. Using this FWD region 82 as a free-wheeling diode of the IGBT region 81 can reduce the switching loss of the RC-IGBT 97.

In addition, the p region 14 and the p⁺ region 15 do not overlap each other. This prevents the formation of a portion where the impurity concentration locally exceeds the impurity concentration of the p⁺ region 15. It is thus possible to further improve the recovery characteristics.

The p layer 47 is preferably formed on the entire top surface S1 in the FWD region 82. In this case, it is possible to maintain the withstand voltage more favorably.

It should be noted that the present invention can be implemented by freely combining embodiments described above or by making modifications or omissions on those embodiments as appropriate without departing from the scope of the present invention. For example, the gate structure of the IGBT region may be of a plane type rather than of a trench type. The carrier storing layer may be omitted. While the above-described embodiments take the example of the case where the first conductivity type is regarded as the n type and the second conductivity type as the p type, these types may be substituted for each other.

While the invention has been shown and described in detail, the foregoing description is in all aspects illustrative and not restrictive. It is therefore to be understood that numerous modifications and variations can be devised without departing from the scope of the invention.

What is claimed is:

1. A power semiconductor device having an IGBT region and a diode region for reverse conduction of said IGBT region, the power semiconductor device comprising:
    a semiconductor substrate having a first surface and a second surface opposite said first surface, said first surface having a portion included in said IGBT region and a portion included in said diode region, said semiconductor substrate including,
        a first layer of a first conductivity type that is provided on said second surface and is at least partially included in said diode region,
        a second layer of said first conductivity type that is in contact with said first layer in said diode region, and
        a third layer of a second conductivity type that is provided on said first surface and away from said second surface, is at least partially included in said diode region, and is in contact with said second layer, said second conductivity type being different from said first conductivity type;
    an interlayer insulating film that is provided on said first surface of said semiconductor substrate and has a diode opening that exposes part of said third layer;
    a first electrode that is provided on said interlayer insulating film and is in contact with said third layer through said diode opening; and
    a second electrode that is provided on said second surface of said semiconductor substrate and is in contact with said first layer,
    wherein said third layer includes a first region, a second region that is disposed away from said first region, and a diffusion region that connects said first region and said second region, said second region having a higher impurity concentration than an impurity concentration of said first region and said diffusion region having a lower impurity concentration than impurity concentrations of said first region and said second region when impurities in a direction parallel to said first surface of said semiconductor substrate are compared, and
    wherein said first electrode is in contact with only said second region of said third layer.

* * * * *